United States Patent
Pera et al.

(10) Patent No.: US 9,899,973 B2
(45) Date of Patent: Feb. 20, 2018

(54) SPLIT CASCODE CIRCUITS AND RELATED COMMUNICATION RECEIVER ARCHITECTURES

(71) Applicant: INPHI CORPORATION, Santa Clara, CA (US)

(72) Inventors: Florin Pera, Dunrobin (CA); Stephane Dallaire, Gatineau (CA); Brian Wall, Stittsville (CA)

(73) Assignee: INPHI CORPORATION, Santa Clara, CA (US)

( * ) Notice: Subject to any disclaimer, the term of this patent is extended or adjusted under 35 U.S.C. 154(b) by 14 days.

(21) Appl. No.: 15/073,735

(22) Filed: Mar. 18, 2016

(65) Prior Publication Data

US 2017/0272046 A1 Sep. 21, 2017

(51) Int. Cl.

| H03F 1/02 | (2006.01) |
|---|---|
| H03F 3/193 | (2006.01) |
| H03M 1/66 | (2006.01) |
| H03F 3/45 | (2006.01) |
| H03F 3/16 | (2006.01) |
| H03G 3/30 | (2006.01) |
| H04Q 11/00 | (2006.01) |
| H04B 10/54 | (2013.01) |

(52) U.S. Cl.
CPC ........... *H03F 3/45179* (2013.01); *H03F 3/16* (2013.01); *H03G 3/30* (2013.01); *H04B 10/541* (2013.01); *H04Q 11/0071* (2013.01); H03F 2200/135 (2013.01); H03F 2200/18 (2013.01); H03F 2200/405 (2013.01); H03F 2203/45212 (2013.01); H03F 2203/45288 (2013.01); H04Q 2011/0013 (2013.01); H04Q 2011/0035 (2013.01)

(58) Field of Classification Search
USPC ................................. 398/138, 136, 135, 140
See application file for complete search history.

(56) References Cited

U.S. PATENT DOCUMENTS

| 5,923,216 | A | * | 7/1999 | Pennock | H03F 3/45479 330/255 |
|---|---|---|---|---|---|
| 5,977,828 | A | * | 11/1999 | Hu | H03F 3/45103 330/254 |
| 6,388,476 | B1 | * | 5/2002 | Isobe | G11B 5/022 327/110 |
| 6,487,687 | B1 | * | 11/2002 | Blake | H03K 3/356113 324/762.07 |
| 6,882,294 | B2 | * | 4/2005 | Linder | H03M 1/0682 341/154 |
| 7,164,317 | B1 | * | 1/2007 | Lorenz | H03F 1/223 330/255 |
| 7,202,744 | B1 | * | 4/2007 | Manganaro | H03F 1/303 330/288 |

(Continued)

*Primary Examiner* — Oommen Jacob
(74) *Attorney, Agent, or Firm* — Richard T. Ogawa; Ogawa P.C.

(57) ABSTRACT

Split cascade circuits include multiple cascade paths coupled between voltage supply rails. Each cascade path includes a pair of controllable switches. A feedback path is provided for at least one of the cascade circuit paths. An active load circuit may also have a split cascade structure. Multiple-stage circuits, for implementation in Trans-Impedance Amplifiers (TIAs) or analog Receive Front-End modules (RXFEs), for example, include multiple stages of split cascade circuits.

26 Claims, 19 Drawing Sheets

(56) References Cited

U.S. PATENT DOCUMENTS

| | | | | |
|---|---|---|---|---|
| 7,676,213 B2* | 3/2010 | Taylor | | G05F 1/46 327/540 |
| 8,390,491 B2* | 3/2013 | Wakimoto | | G05F 1/56 323/312 |
| 8,922,409 B2* | 12/2014 | Tao | | H03K 3/01 341/135 |
| 2003/0030495 A1* | 2/2003 | Franca-Neto | | H03F 1/223 330/302 |
| 2005/0030213 A1* | 2/2005 | May | | H03M 1/0682 341/144 |
| 2005/0073452 A1* | 4/2005 | Manganaro | | H03M 1/72 341/150 |
| 2007/0279270 A1* | 12/2007 | Chida | | H03M 1/0612 341/144 |
| 2008/0170455 A1* | 7/2008 | Bedarida | | G11C 7/02 365/210.11 |
| 2008/0224775 A1* | 9/2008 | Taylor | | H03F 1/223 330/254 |
| 2011/0050470 A1* | 3/2011 | Kimura | | H03M 1/745 341/136 |
| 2012/0223696 A1* | 9/2012 | Olson | | H01L 22/34 324/76.11 |
| 2013/0082782 A1* | 4/2013 | Leuschner | | H03F 1/223 330/291 |
| 2014/0210554 A1* | 7/2014 | Abdelhalem | | H03F 1/22 330/296 |
| 2014/0300417 A1* | 10/2014 | Xu | | H03F 1/342 330/278 |
| 2014/0354363 A1* | 12/2014 | Kim | | H03F 3/211 330/296 |
| 2015/0145607 A1* | 5/2015 | Caffee | | H03L 5/00 331/15 |
| 2016/0349785 A1* | 12/2016 | Ciubotaru | | G05F 3/262 |

\* cited by examiner

SPLIT CASCODE CIRCUITS AND RELATED COMMUNICATION RECEIVER ARCHITECTURES

FIELD

The present disclosure relates generally to communication receivers and, in particular, to analog circuits in such receivers.

BACKGROUND

Trans-Impedance Amplifiers (TIAs) and analog Receive Front-End modules (RXFEs) are key components in optical communication systems. Recent developments in the field, such as 4-level Pulse Amplitude Modulation (PAM4) systems, require high performance TIAs or RXFEs in terms of linearity, gain, bandwidth, dynamic range, and power.

BRIEF DESCRIPTION OF THE DRAWINGS

Examples of embodiments of the invention will now be described in greater detail with reference to the accompanying drawings.

FIGS. 12A, 12B, and 120 are schematic diagrams of example multiple split cascode circuits.

DETAILED DESCRIPTION

As noted above, modern communication systems may require high performance TIAs or RXFEs in terms of linearity, gain, bandwidth, dynamic range, and power. Complementary Metal Oxide Semiconductor (CMOS) based designs tend to offer the lowest power consumption. However, maintaining parameters like linearity, gain, bandwidth, and noise can become a challenge, even for designs based on the latest sub-micron CMOS technologies with very high transition frequency ($f_t$) and maximum oscillation frequency ($f_{max}$).

For linear TIAs/RXFEs, there should be effective control on major parameters like noise, bandwidth and peaking, phase linearity, and distortion or Total Harmonic Distortion (THD) over a wide range of input signal levels or temperature. At the same time, in a PAM4 or similar optical data system, as opposed to Non-Return to Zero (NRZ) or PAM2, the specifications for these parameters are significantly tightened in order to achieve target Signal to Noise Ratio (SNR) levels.

In other words, it may be desirable for linear TIA or RXFE gain stages to have high performance under maximum gain conditions, and control of important parameters as mentioned above over a wide range of input signal levels, and over temperature and/or other environmental conditions.

Moreover, the gain control mechanism of a linear TIA/RXFE circuit should not interfere with other closed loop feedback circuits, such as those that may be used for offset and input Direct Current (DC) compensation, which could impact stability of a system.

The present application discloses, by way of example, a set of CMOS based circuits and architectures that may be implemented in linear or non-linear TIA/RXFE circuits including for use in coherent systems. The CMOS components and TIA or RXFE implementations are intended solely as illustrative and non-limiting examples. Other types of components and/or other possible implementations may be or become apparent.

Figure 1A:
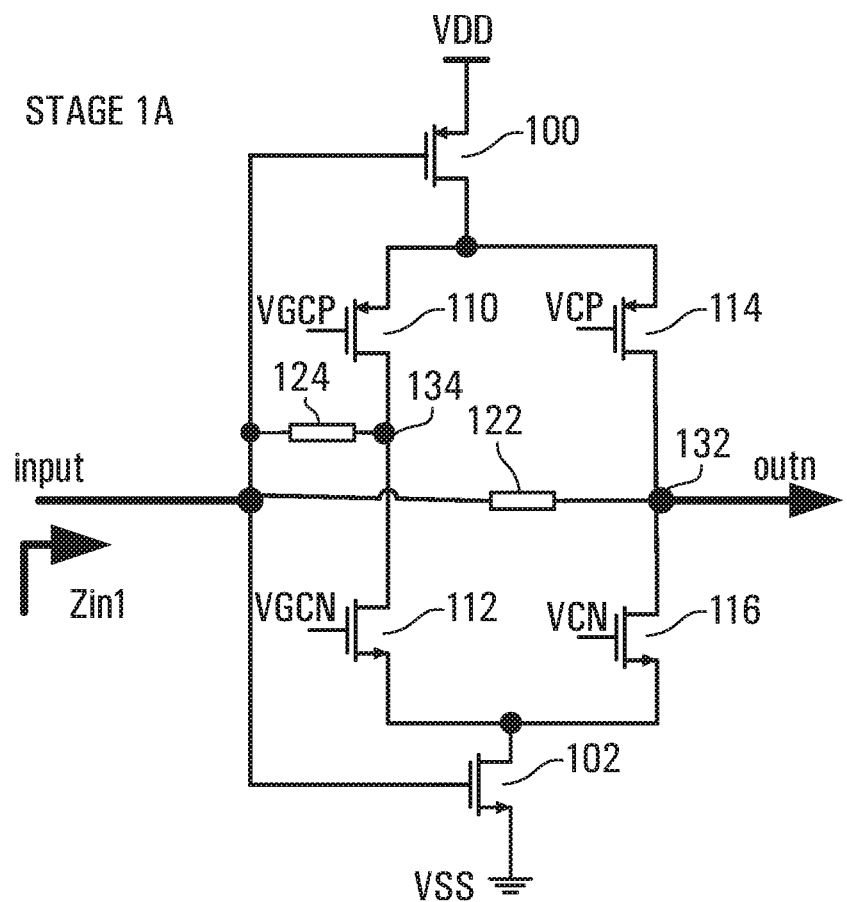
FIGS. 1A and 1B include schematic diagrams and symbols for two example split cascode circuits.
Figure 1A:
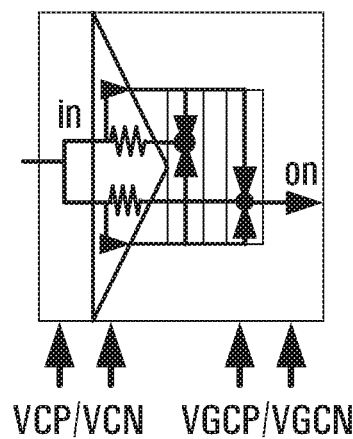
Figure 1B:
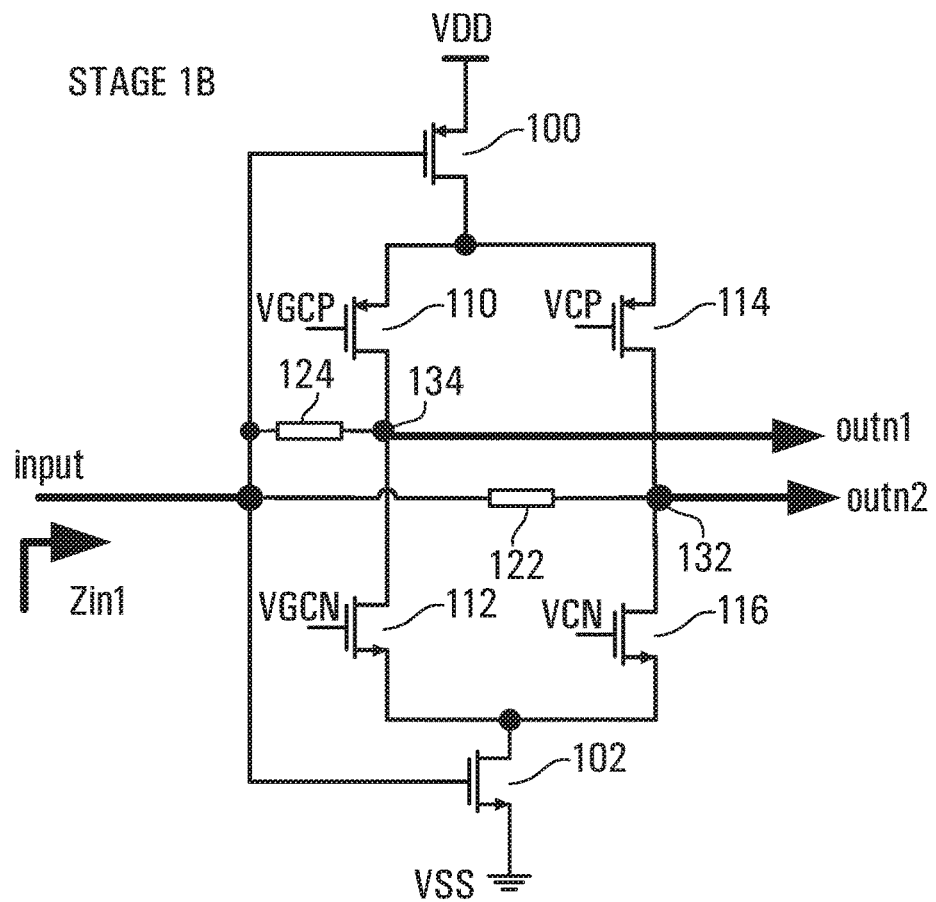
Figure 1B:
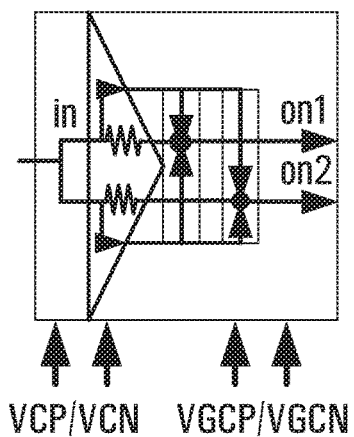

FIGS. 1A and 1B include schematic diagrams and symbols for two example split cascode circuits. The labels "STAGE 1A" and "STAGE 1B" and the example symbols in FIGS. 1A and 1B, and the labels and symbols in other drawings, are included to facilitate subsequent references to the various example circuits.

Both of the example circuits in FIGS. 1A and 1B are dual split cascode CMOS inverters. Controllable switches, in the form of MOS Field Effect Transistors (MOSFETs) 100, 102, are coupled to respective voltage supply rails VDD and VSS, and their control (gate) terminals are coupled together. A split cascode structure with multiple cascode circuit paths is coupled between the MOSFETs 100, 102. Each cascode circuit path includes a pair of controllable switches, again in the form of MOSFETS 110/112, 114/116. Feedback paths, including feedback circuits 122, 124, are coupled to the control terminals of the MOSFETs 100, 102, and to respective feedback points 132, 134.

The controllable switches in FIGS. 1A and 1B, and in other drawings herein, are shown as MOSFETs, but other implementations are possible. CMOS implementations may use gate (control) terminal connections and drain/source (current carrying or conduction) terminal connections as shown in the examples herein. In other implementations, controllable switches may have different types of control terminals and/or current carrying terminals.

An input, to receive an input signal shown as "input", is coupled to the gate terminals of the MOSFETs 100, 102. An output is coupled to an output point 132 in FIG. 1A, and an output signal is shown as "outn". There are multiple output points 132, 134 in FIG. 1B, and multiple output signals "outn1", "outn2". An input or output could be a port, connector, or terminal, or could instead be simply a connection to an input or output point in the split cascode circuits.

Although the output points 132, 134 in FIGS. 1A and 1B correspond to feedback points in the schematic diagrams shown, this need not be the case in all embodiments. Inputs, outputs, and/or feedback paths, for example, could be connected to the same circuit nodes without all being connected to the same physical points. Conversely, the same node, or even the same connection point in a circuit, could serve multiple purposes, as an input point connected to an input node, an output point connected to an output node, and/or feedback points connected to nodes in a circuit.

The feedback circuits 122, 124 could include complex passive networks built with a combination of RLC (resistive, inductive, capacitive) components and/or other components, including active components. A feedback circuit 122, 124 could instead be implemented with just a resistive component such as a trimmable resistance or simple resistor. The feedback circuits 122, 124 could be implemented using the same types of components or different types of components, and need not be identical. The specific structures of the feedback circuits 122, 124 are implementation-dependent, in accordance with a target transfer characteristic or frequency response of the Stage 1A circuit or the Stage 1B circuit, and similarly the other circuits disclosed herein, for any particular application.

In the Stage 1A and Stage 1B circuits, the cascade circuit path that includes MOSFETs 114, 116 could be considered a primary or main branch, and the cascade circuit path that includes MOSFETs 110, 112 could be considered a secondary branch. In operation, the MOSFETs 110/112, 114/116 in each cascade circuit path is controlled by gain control signals VGCP, VGCN and cascade bias voltages VCP, VCN respectively. In other embodiments, the controllable switches in either one of the cascade circuit paths could be controlled by the gain control signals VGCP, VGCN, and the control terminals in the other cascade circuit branch could be set to fixed voltages, for example.

The Stage 1A and Stage 1B circuits are examples of dual split cascade CMOS inverter arrangements with feedback networks applied to both branches. Depending on the desired transfer function and input impedance, the MOSFETs 110/112, 114/116 in each cascade branch could be completely turned ON or OFF or be controlled to conduct part of the total current. This control is performed through the cascade transistor gate voltages VCP/VCN and gain control signals VGCP/VGCN which are supplied to the MOSFET control terminals as shown. It should be noted that, even if control terminals of the MOSFETs in a cascade circuit path are set to fixed voltages, the fixed voltages still control current conduction through that cascade circuit path.

For instance, if the main cascade branch including the MOSFETs 114, 116 is biased for taking the whole current flowing between the voltage rails VDD, VSS through the MOSFETs 100, 102 while the other cascade branch is OFF, then in this state the feedback circuit 122 defines the gain and input impedance. When controlling VGCP/VGCN to drain current through the secondary branch including the MOSFETs 110, 112, the secondary branch becomes active and the overall feedback is now a combination of the feedback circuits 122, 124, and the secondary branch is steering current from the main branch.

By controlling the gates of the cascade transistors 110/112, 114/116, the currents through the cascade circuit paths are varied and consequently the gain through each cascade branch varies as well. The gain adjustment through the split cascade structure, combined with the individual feedback circuits 122, 124, provide direct control of the transfer function for an input signal "input" to "outn" in Stage 1A or "input" to "outn1"/"outn2" in Stage 1B.

Modulation of the input impedance "Zin1", which impacts dynamic range capability, may also be provided through the transistor control and design of the feedback circuits. The Stage 1A or Stage 1B split cascade circuit may enable very low input impedances Zin1 to be achieved with minimum impact on noise.

For a linear TIA, reducing the input impedance Zin1 to very low values could be an important feature. A low Zin1 can be used to sufficiently shunt an incoming large signal, from a photodiode in an optical receiver for example, so that even with a high input signal level, TIA stages are operated in a linear mode over a wide dynamic range. In real systems, the required minimum Zin1 could be in the range of several ohms, which is not realistic to obtain by controlling a simple shunt resistor as an alternative to a split cascade structure as disclosed herein.

As noted above, a single output signal "outn" from a split cascade circuit could be used as shown for Stage 1A, with an output coupled to an output point between the pair of controllable switches of one of the cascade circuit paths. Multiple outputs could be coupled to respective output points between the pairs of controllable switches of two of the cascade circuit paths as shown for Stage 1B, to provide two output signals "outn1" and "outn2" in this example. Whether a single output or multiple outputs are used could be implementation-dependent, according to where in a TIA or RXFE architecture a split cascade circuit is to be used for example. As shown by way of example in FIGS. 4 to 7 and discussed below, the Stage 1A split cascade circuit could be used as a front-end block in a receiver. Although the Stage 1B split cascade circuit has the same components as the Stage 1A circuit, the two outputs of the Stage 1B circuit could be useful in an intermediate stage in a TIA/RXFE architecture.

Figure 2A:
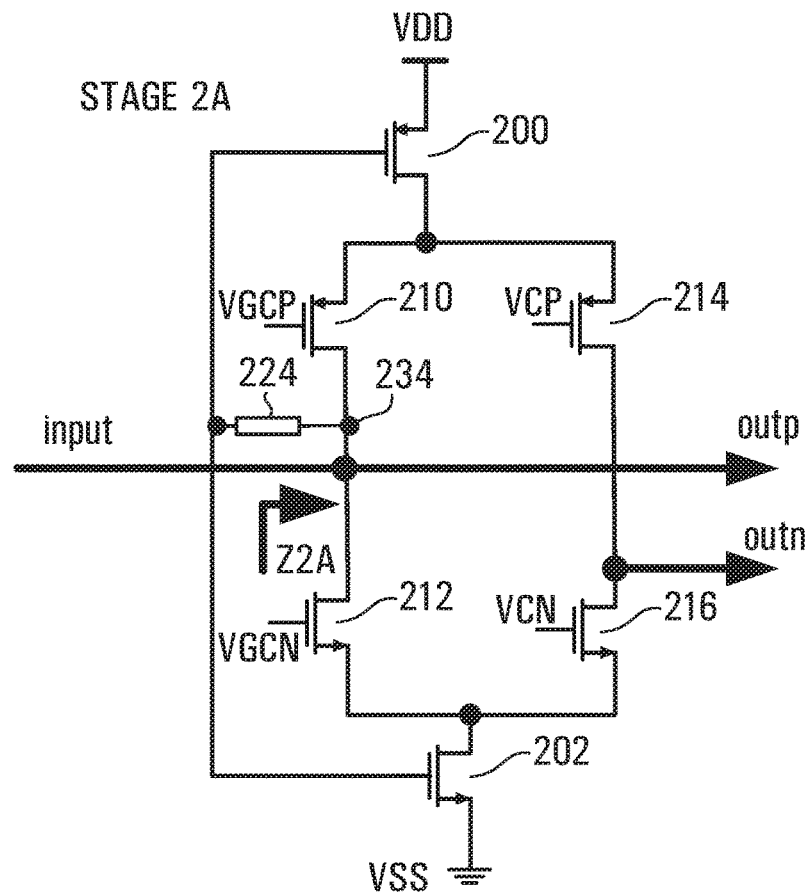
FIGS. 2A and 2B include schematic diagrams and symbols for two further example split cascode circuits.
Figure 2A:
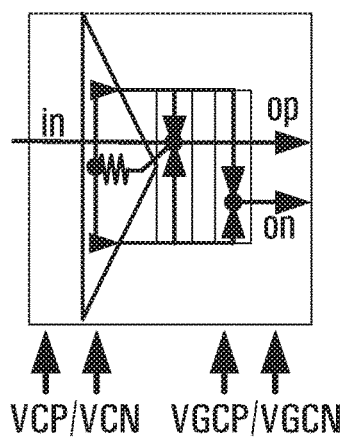
Figure 2B:
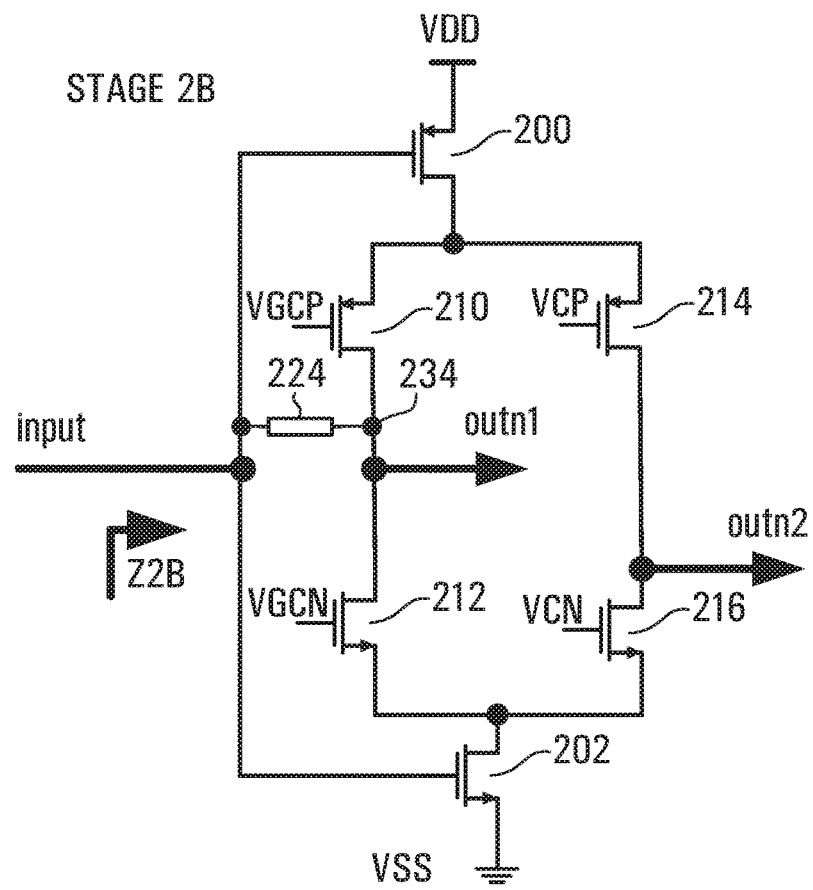
Figure 2B:
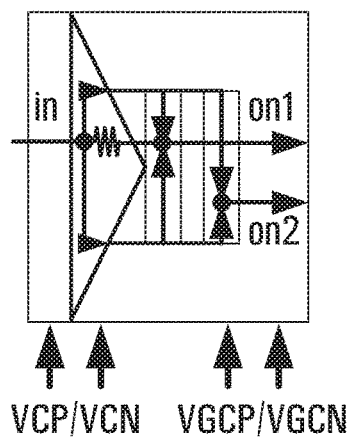

FIGS. 2A and 2B include schematic diagrams and symbols for two further example split cascade circuits. The Stage 2A and Stage 2B split cascade circuits are similar to the Stage 1A and Stage 1B circuits, and include MOSFETs 200, 202 coupled to the voltage supply rails VDD and VSS, with their gate terminals coupled together. A split cascade structure with multiple cascade circuit paths is coupled between the MOSFETs 200, 202, and each cascade circuit path includes a pair of MOSFETS 210/212, 214/216. In the Stage 2A and Stage 2B circuits, however, there is only one feedback path with a feedback circuit 224, coupled to a feedback point 234 between the MOSFETs 210, 212 in one of the cascade circuit paths. Although FIGS. 2A and 2B show the removal of the feedback path from the main cascade branch (MOSFETs 214, 216) relative to the Stage 1A and Stage 1B circuits, in other embodiments the feedback path could instead be provided in the main cascade branch and removed from the secondary cascade branch (MOSFETs 210, 212).

Figure 3A:
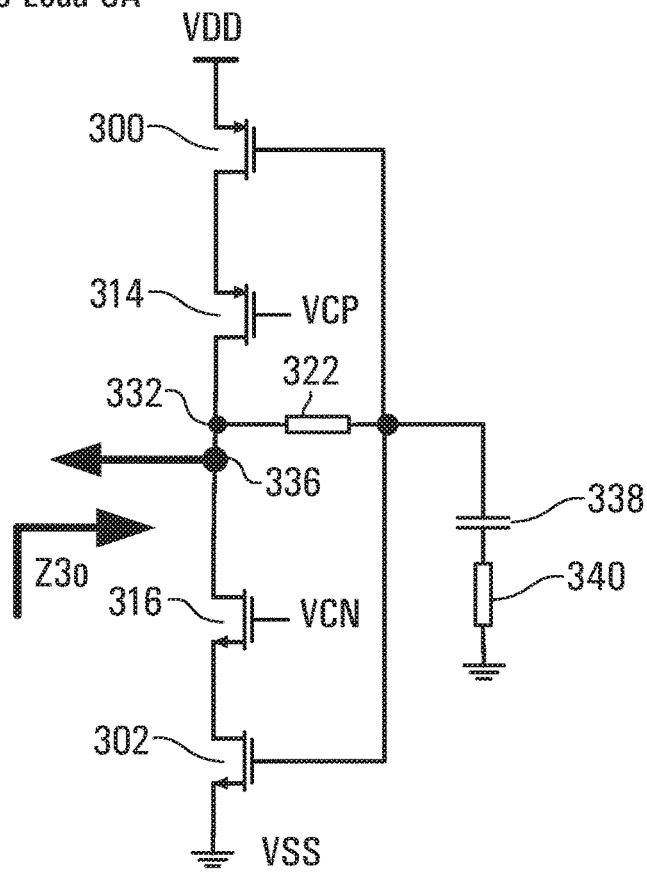
FIGS. 3A and 3B include schematic diagrams and symbols for two example active load circuits.
Figure 3A:
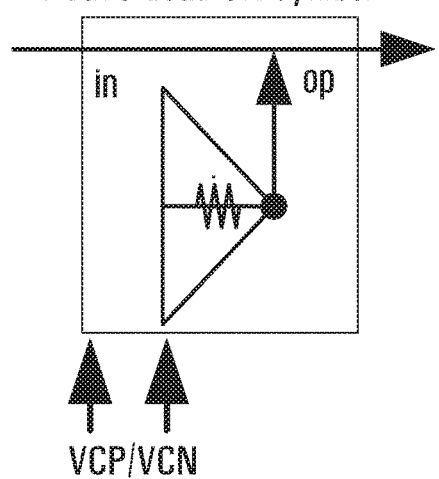
Figure 3B:
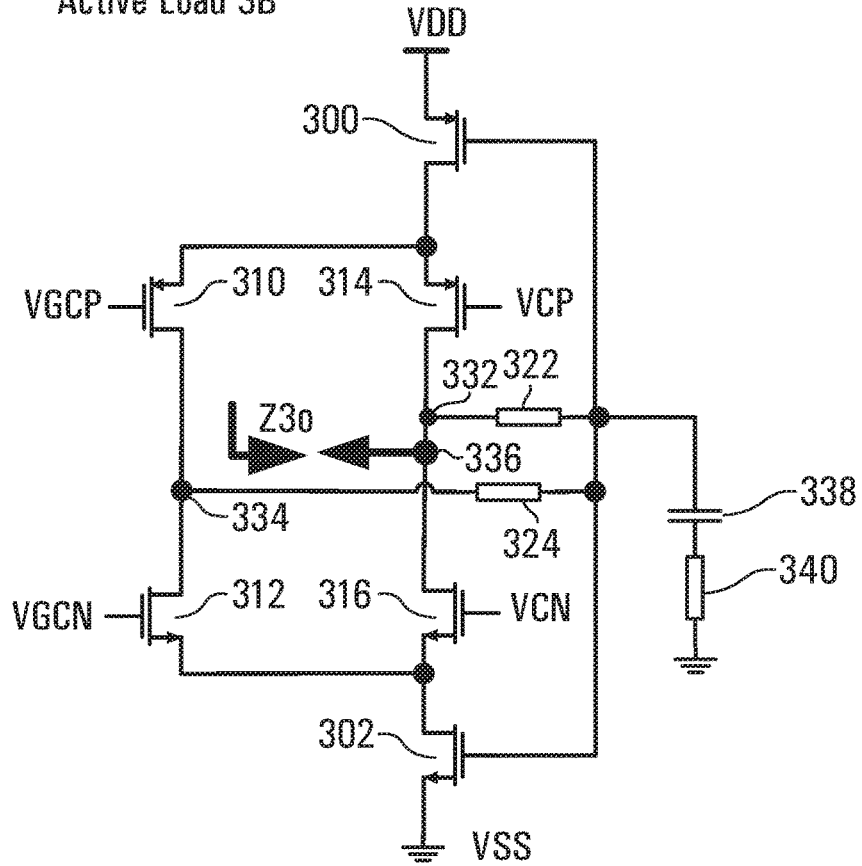
Figure 3B:
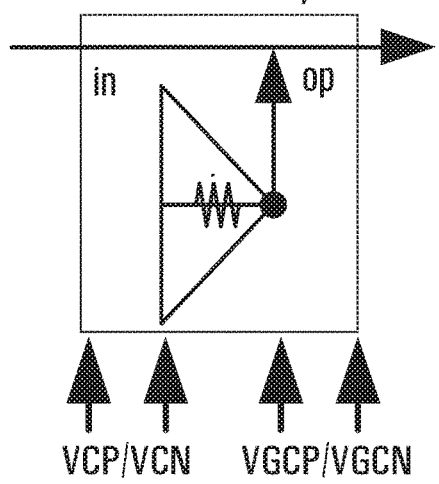

Thus, the Stage 2A and Stage 2B circuits differ from the Stage 1A and Stage 1B circuits by the removal of one of the feedback paths. In an embodiment, one of the outputs of the Stage 2B circuit is connected to another circuit to aid in maintaining the output signal "outn2" at a desired DC level and with controlled output impedance. As an example, a circuit as shown in FIG. 3A or FIG. 3B could be used for that purpose.

The Stage 2A circuit has the same components as the Stage 2B circuit. However, the input in the Stage 2A circuit is connected to an input point between the MOSFETs 210, 212 at the drains of the MOSFETs, which is also the output of that cascade branch. The input signal "input" is therefore passed through as an output "outp" in the Stage 2A circuit.

Operation of the Stage 2A circuit and the Stage 2B circuit are substantially the same as described above for the Stage 1A circuit and the Stage 1B circuit.

The Stage 1B, Stage 2A, and Stage 2B circuits all receive a single ended input signal and provide two output signals. The outputs do not necessarily send a perfect differential signal, but these example circuits could be used as stages for amplifying the single ended input signal and providing conversion towards a differential output while offering high dynamic range and linearity performance. Simulations indicated that through any of these circuits, a very high gain dynamic range can be achieved while maintaining excellent linearity, noise level control, and Alternating Current (AC) characteristics. Similar or different performance may be observed in other simulations and/or in actual implementations.

FIGS. 3A and 3B include schematic diagrams and symbols for two example active load circuits. Two variants, Active Load 3A and Active Load 3B, are presented by way of example. Active Load 3A includes a cascade CMOS inverter stage with a feedback circuit 322, along with an AC coupled impedance, and Active Load 3B includes a dual split cascade CMOS inverter similar to the Stage 1A and Stage 1B circuits, with an AC coupled impedance.

Both the Active Load 3A circuit and the Active Load 3B circuit include MOSFETs 300, 302 that are respectively coupled to the voltage supply rails VDD, VSS and have their gate terminals coupled to the load. In FIGS. 3A and 3B, the load is an AC coupled load that includes a capacitor 338 and a circuit 340 of a complex impedance. A cascade circuit path is coupled between the MOSFETs 300, 302, and includes a pair of MOSFETs 314, 316. A feedback path including a feedback circuit 322 is coupled between the load and a feedback point 332 between the MOSFETs 314, 316 of the cascade circuit path. A load point 336 between the pair of controllable switches of the cascade circuit path could be coupled to an output of a Stage 1B, Stage 2A, or Stage 2B circuit, for example. Output impedance of the Active Load 3A circuit and the Active Load 3B circuit is shown as Z3o.

The Active Load 3B circuit is a split cascade circuit, and adds another cascade circuit path between the MOSFETs 300, 302. This cascade circuit path includes another pair of MOSFETs 310, 312, and another further feedback path, with a feedback circuit 324, between the load circuit and another feedback point 334.

The output AC impedance Z3o of the Active Load 3A circuit or the Active Load 3B circuit is a function of the impedances of the feedback circuits 322, 324, the load impedance 340, and the gain of the active (amplifier) stage MOSFETs 300/314/316/302 (for the Active Load 3A circuit) or the split gain through the MOSFETs 300/314/316/302 and 300/310/312/302 (for the Active Load 3B circuit). In operation, any of these three main components or mechanisms—impedances of feedback circuits 322, 324, the load impedance 340, and the active/split stage gain (through the VGCP/VGCN controls) in the case of the Active Load 3B circuit—can be varied in order to control the output impedance Z3o. In an embodiment, the cascade stage 300/314/316/302 is always active in order to maintain a target DC level at access point 332. As an example, a capacitive load impedance at 340 has an inductive equivalent effect at Z3o. The varactor in FIG. 10, described below, has a similar effect. With simple resistors as the feedback circuits 322, 324, the feedback circuit 322 along with the active stage gain (Active Load 3A), or the feedback circuits 322, 324 along with the split gain between MOSFETs 300/314/316/302 and MOSFETs 300/310/312/302 (Active Load 3B), define the DC/low frequency Z3o impedance so that Z3o is proportional to the feedback resistance and inversely proportional to the active stage gain.

The Active Load 3A and Active Load 3B circuits may be useful in the example architectures in FIGS. 4 to 7, described below. Such architectures, and others, could include an intermediate stage with two outputs, one of which is coupled to an Active Load 3A circuit or an Active Load 3B circuit, for example.

In the case of an intermediate stage of a Stage 2A or Stage 2B type, for example, an Active Load 3A circuit or an Active Load 3B circuit could be connected to the Stage 2A/Stage 2B floating output (the output with no feedback path) to help maintain a target DC level of the output signal at that output. In addition, an Active Load 3A circuit or an Active Load 3B circuit could be used to help control the output impedance at an output node, thus defining the AC transfer characteristic through the associated cascade branch and the gain from "input" to "outn" in the Stage 2A circuit or from "input" to "outn2" in the Stage 2B circuit.

Where an intermediate stage is of Stage 1A or Stage 1B type, an active load circuit might not necessarily be used for maintaining DC level, but could be used for additional transfer function tuning or control, for example. An active load circuit could thus be used in connection with an output that does or does not have a feedback path. As shown by way of example in FIG. 11, described below, an active load circuit could be provided for both outputs of a split cascode circuit.

The output impedance Z3o of the example active load circuits is a function of the feedback circuit(s) 322 for the Active Load 3A circuit or 322, 324 for Active Load 3B circuit, the load 338, 340, the cascade MOSFET gate control signals "VCP"/"VCN"/"VGCP"/"VGCN", the intrinsic cascade inverter stage transfer function and output impedance for the Active Load 3A circuit, and the intrinsic dual cascade inverter transfer function and output impedance for the Active Load 3B circuit.

FIGS. 4 to 7 are block diagrams illustrating example architectures that include stages of split cascade and active load circuits. These diagrams represent illustrative and non-limiting example applications of these circuits, and present a series of four architectures combining the various circuits introduced in the present disclosure.

The TIA/RXFE architecture examples in FIGS. 4 to 7 include a Stage 1A front-end circuit, an intermediate stage that includes one of the Stage 2A circuit (FIG. 4), the Stage 2B circuit (FIG. 5), and the Stage 1B circuit (FIGS. 6 and 7), and an Active Load 3B circuit. Although a differential gain stage including an amplifier 400, 500, 600, 700 is also shown, in other embodiments an intermediate stage may or may not be followed by a differential stage amplifier or other component that could be used to provide additional gain control. Also, although the Active Load 3B circuit is used in these examples, the Active Load 3A circuit could also or instead be used. Other variations are also possible.

Figure 8:
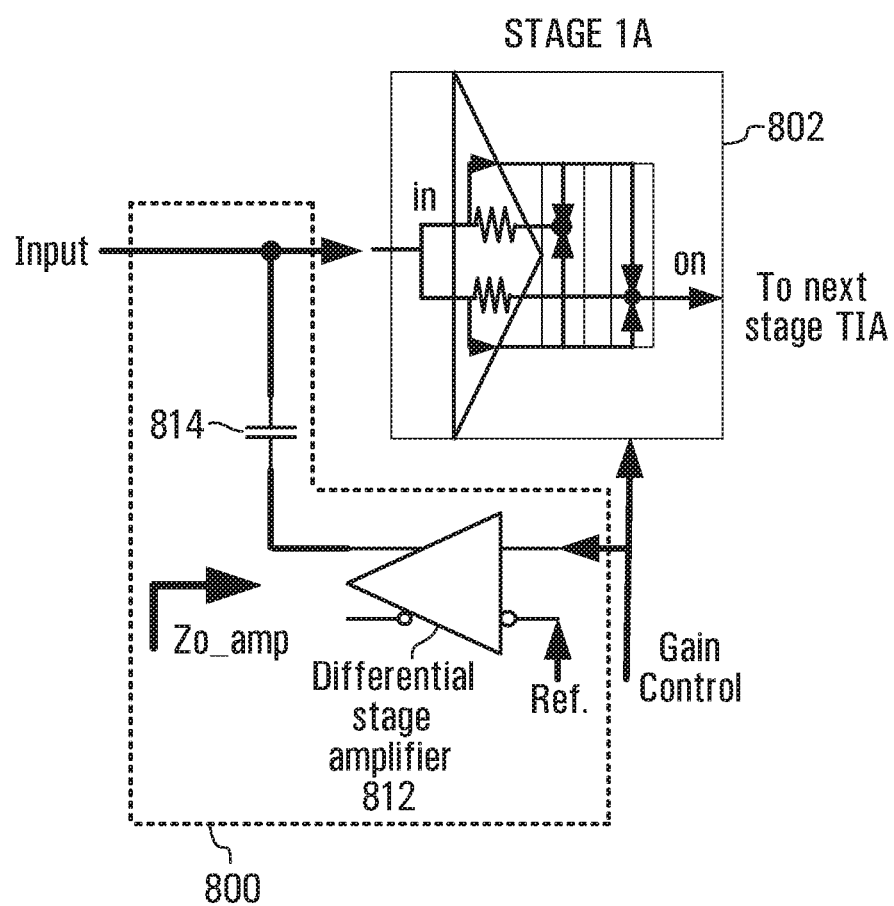
FIG. 8 is a block diagram illustrating an example input circuit.

FIG. 8 is a block diagram illustrating an example input circuit, for limiting AC characteristic peaking level at the input of a circuit such as a TIA or an RXFE circuit. The input circuit 800 is coupled to the input of a Stage 1A circuit 802 in the example shown. In other embodiments, the input circuit 800 could be coupled to the input of other types of circuits, including the Stage 1B, Stage 2A, and/or Stage 2B circuits. An amplifier, which is a differential amplifier 812 in the example shown, is coupled to receive a gain control signal and a reference signal or level. A capacitor 814 couples an output of the amplifier to the input of the Stage 1A circuit 802. The reference input level sets a threshold for activating bandwidth compensation by the circuit 800. A gain control signal that exceeds the reference level will lower the output impedance of the differential stage amplifier 812, which in series with the capacitor 814 forms a single pole low pass filter at the input node, which in the example shown is a Stage 1A input. In this example, the input circuit 800, consisting of the capacitor 814 in series with a controlled active output impedance of the amplifier 812, forms an additional single pole low pass filter configuration at the input access point or node.

The input circuit 800 relates to one method of controlling the AC peaking characteristic, at a TIA/RXFE input for example, and could be used in any of the example architectures shown in FIGS. 4 to 7. When an input stage, which is the Stage 1A circuit in each of FIGS. 4 to 7, is set to low gains, the input impedance is lowered. Due to associated TIA/RXFE input reactive elements, the AC characteristic may present significant peaking. The gain control signal, based upon which the controllable switches in the secondary cascade circuit path are controlled (e.g., VGCP or VGCN) is used to vary the output impedance of the differential stage amplifier 812. With an input stage set to low gain, its input impedance has low values and there can be a very high peaking transfer function. In the input circuit 800, the capacitance 814 with the differential amplifier low output impedance adds one pole into the system, which reduces the AC characteristic peaking level.

Figure 9:
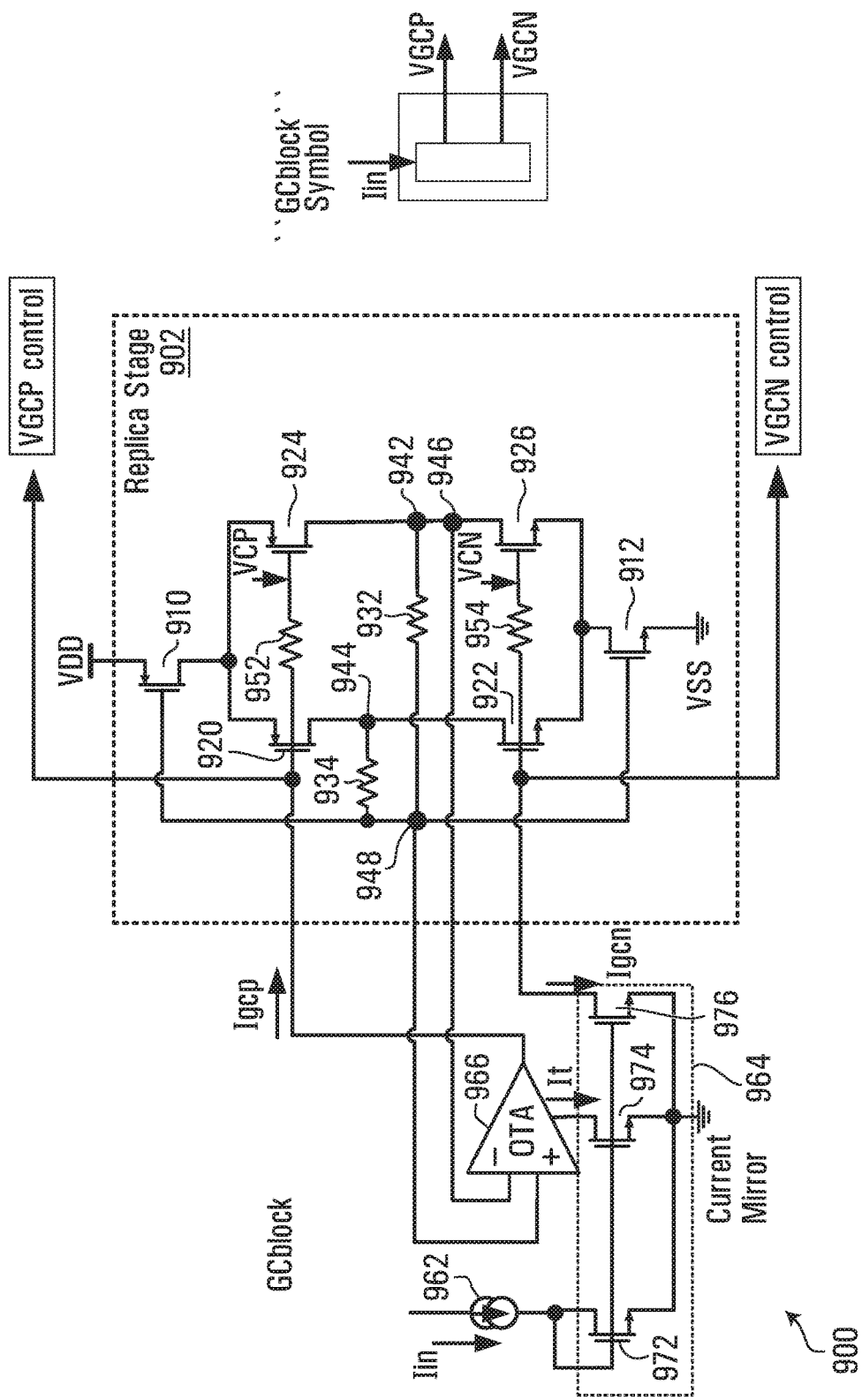
FIG. 9 includes a schematic diagram and symbol for an example gain controller.

FIG. 9 includes a schematic diagram and symbol for an example gain controller. FIG. 9, and similarly FIG. 10 described below, relate to examples of biasing the "Stage" and "Active Load" circuits. In FIG. 9, the gain control cascade voltages VGCP and VGCN are generated from a single input variable current produced by a gain control loop. The example gain controller includes a current mirror and amplifier stage 900 and a "replica" split cascade stage 902.

The replica stage 902 is similar in structure to the Stage 1A and Stage 1B split cascade circuits. Controllable switches in the form of MOSFETs 910, 912 are respectively coupled to the voltage supply rails VDD, VSS, and their control (gate) terminals are coupled together. Multiple cascode circuit paths are coupled between the MOSFETs 910, 912, and each of the cascode circuit paths of the replica stage 902 includes a pair of MOSFETs 920/922, 924/926. Feedback paths are coupled to the control terminals of the MOSFETs 910, 912 and to respective feedback points 942, 944 between the pairs of MOSFETs 920/922, 924/926. The feedback paths include feedback circuits, which in this example are resistors 932, 934. The gate terminals of the p-channel MOSFETs 920, 924 are coupled together through a resistor 952, and the gate terminals of the n-channel MOSFETs 922, 926 are coupled together through a resistor 954. The gain control signals to control the MOSFETs in a secondary cascade branch (for example, the MOSFETs 110, 112 in the Stage 1A and Stage 1B circuits; the MOSFETs 210, 212 in the Stage 2A and Stage 2B circuits; the MOSFETs 310, 312 in the Active Load 3B circuit) are generated at the gate terminals of the MOSFETs 920, 922 of the replica stage 902.

The current mirror and amplifier stage 900 includes a variable current source 962, a current mirror 964 with MOSFETs 972, 974, 976 coupled to the variable current source, and an amplifier 966 coupled to the current mirror. The current mirror 964, and in particular the MOSFET 976 in this example, is also coupled to the gate terminal of the MOSFET 922 in one of the cascade circuit paths of the replica stage 902. The amplifier 966 has an output coupled to the gate terminal of the MOSFET 920, and inputs coupled across one of the feedback paths. In the example shown, the inputs of the amplifier 966 are coupled across the main cascade branch feedback path, at points 946, 948. The amplifier 966 is a differential trans-admittance amplifier in this embodiment.

The example gain controller in FIG. 9 provides gain control for split cascade circuits, and may also be useful in maintaining cascade branches well balanced throughout the gain control range. Maintaining balance between the pmos and nmos sides in cascade CMOS branches across the gain control range can be important so that gain control does not induce additional DC current through the feedback circuits.

The input current Iin is mirrored and sent as Igcn to the VGCN node coupled to the gate terminal of the MOSFET 922, and is also sent to the amplifier 966 as It. The amplifier 966 senses imbalance that might appear at the point 948 in the replica stage 902 with respect to point 946, or point 944 in another embodiment, and controls the output current Igcp accordingly. The current Igcp is sent to the VGCP node coupled to the gate terminal of the MOSFET 920. The two currents Igcn and Igcp are converted to voltages (VGCN, VGCP) through resistors 954, 952 and are set relative to the respective bias voltages VCN, VCP.

The gain controller in FIG. 9 implements one possible approach to controlling gain of split cascade circuits with a single input current source. However, gain control is not limited to only this approach. For example, the control voltages VGCP/VGCN and VCP/VCN could all be varied, or only one pair of control voltages (VGCN/VGCP or VCP/VCN) could be varied while the other pair is maintained at a fixed level.

Figure 10:
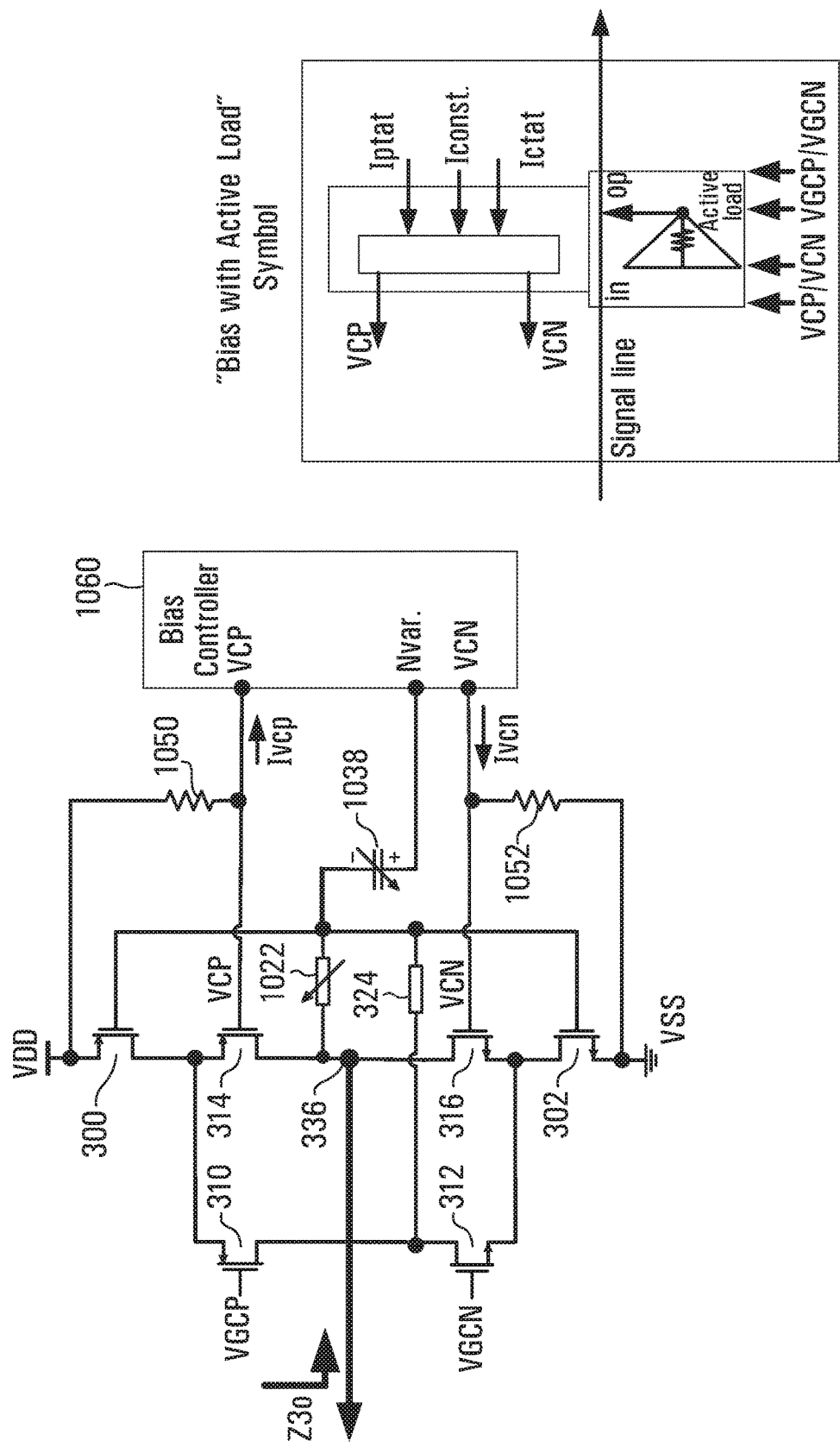
FIG. 10 includes a schematic diagram and symbol for an example temperature and gain control compensator.

FIG. 10 includes a schematic diagram and symbol for an example temperature and gain control compensator. The example circuit shown in FIG. 10 is for generating the main cascode bias voltages VCP, VCN and providing temperature and gain control compensation, which may help in maintaining the AC characteristic within limits. The biasing approach implemented in the circuit in FIG. 10 could be applied to the VCP/VCN nodes for any of the "Stage" circuits. and in FIG. 10 an Active Load circuit AC characteristic is also controlled through a varactor bias function of temperature.

The circuit in FIG. 10 is based on the Active Load 3B circuit, but with the feedback circuit 322 replaced with a variable resistance 1022, the capacitor 338 and impedance 340 replaced with a variable load in the form of a variable capacitor (varactor) 1038 in this example, and the voltage supply rails VDD, VSS respectively coupled to the gate terminals of the MOSFETs 300, 302 through resistors 1050, 1052. For the purpose of controlling the output impedance Z3o, the resistor 1022 is trimmable and the load element 1038 is controlled by the Bias Controller 1060. A variable load could be implemented in other ways, using a more complex circuit, instead of or in addition to using the varactor 1038. The bias controller 1060 is coupled to the gate terminals of the MOSFETs 314, 316, and generates control signals. The generated control signals include currents Ivcp, Ivcn to control the MOSFETs and a signal to control the variable load implemented by the varactor 1038 in this example. In an embodiment, the resistor 1022 is trimmed in a discrete way using digital control, and the Nvar signal to control the load varactor 1038 is a continuous control signal that is generated by the bias controller 1060 and controlled over temperature.

The bias controller 1060 combines various input currents that vary with temperature, including Iptat (a current proportional to absolute temperature) and Ictat (a current complementary to absolute temperature), and Iconst (a constant current over temperature). In an embodiment, a desired slope of the two currents Ivcp and Ivcn over temperature is obtained through a mix (proportional summation) of these three types of input currents Iptat, Ictat, and Iconst, and by using a series of conventional mirror current circuits. The two output currents Ivcp, Ivcn formed at nodes VCP, VCN are converted to voltages through the resistors 1050, 1052 connected to VDD, VSS, respectively. The adjustment of the cascode transistor gate voltages over temperature could be useful in providing better control of the AC characteristic of "Stage" circuit gain stages, for example.

In addition, the bias controller 1060 generates another voltage at node Nvar, which is variable over temperature and which controls the varactor 1038. By re-shaping the Active Load 3B circuit output impedance Z3o as a function of frequency and over temperature, it may be possible to achieve an additional level of AC characteristic control.

The bias controller 1060 thus sets the VCP and VCN cascade node voltages for the "Stage" and "Active Load" circuits, and could be useful in any of various architectures, including the example architectures in FIGS. 4-7, to maintain target AC characteristics over temperature. The bias controller 1060 also generates, at the node Nvar, a voltage that is controlled over temperature and could be useful for continuous and automatic AC characteristic compensation using the Active Load 3B circuit with the varactor 1038.

Finally, by using the Active Load 3B circuit in FIG. 10 instead of the Active Load 3A circuit, the output impedance Z3o may be controlled not only over temperature, but also across the gain range through the gain controls VGCP, VGCN, the secondary cascade branch that includes the MOSFETs 310, 312, and the additional feedback circuit 324. However, the Active Load 3A circuit could instead be used for temperature-only compensation.

Figure 4:
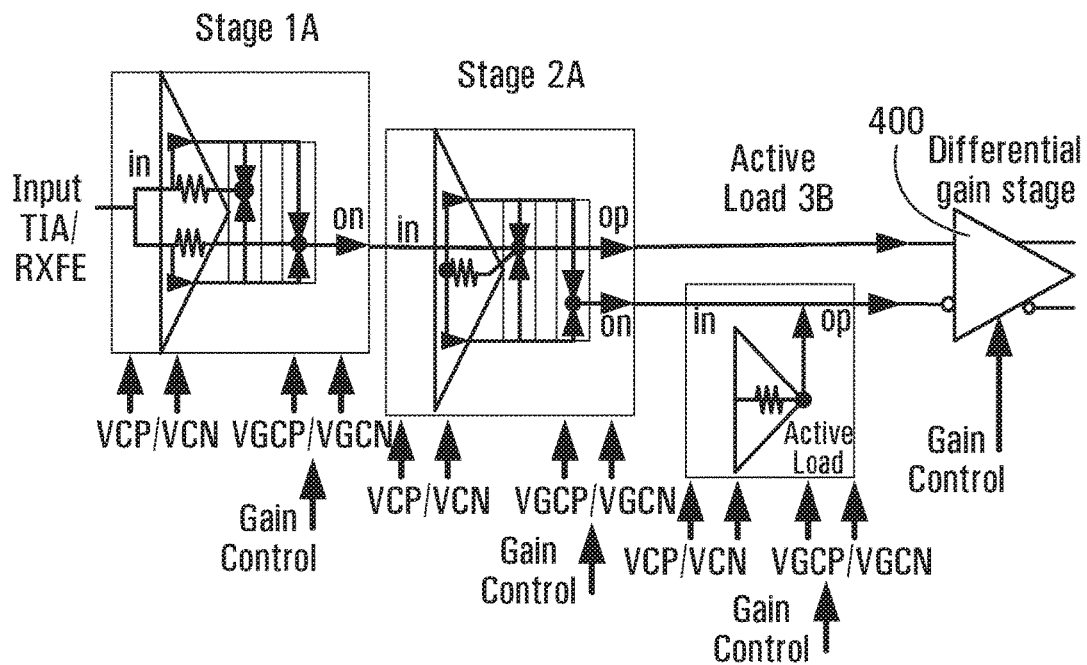
FIGS. 4 to 7 are block diagrams illustrating example architectures that include stages of split cascode and active load circuits.
Figure 5:
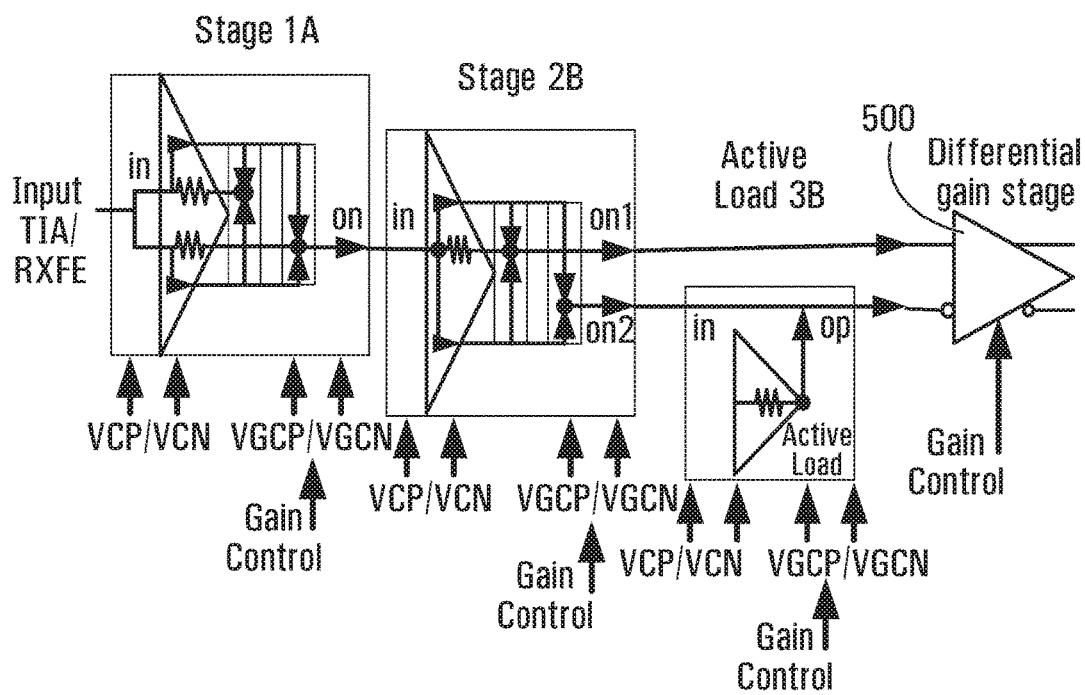
Figure 6:
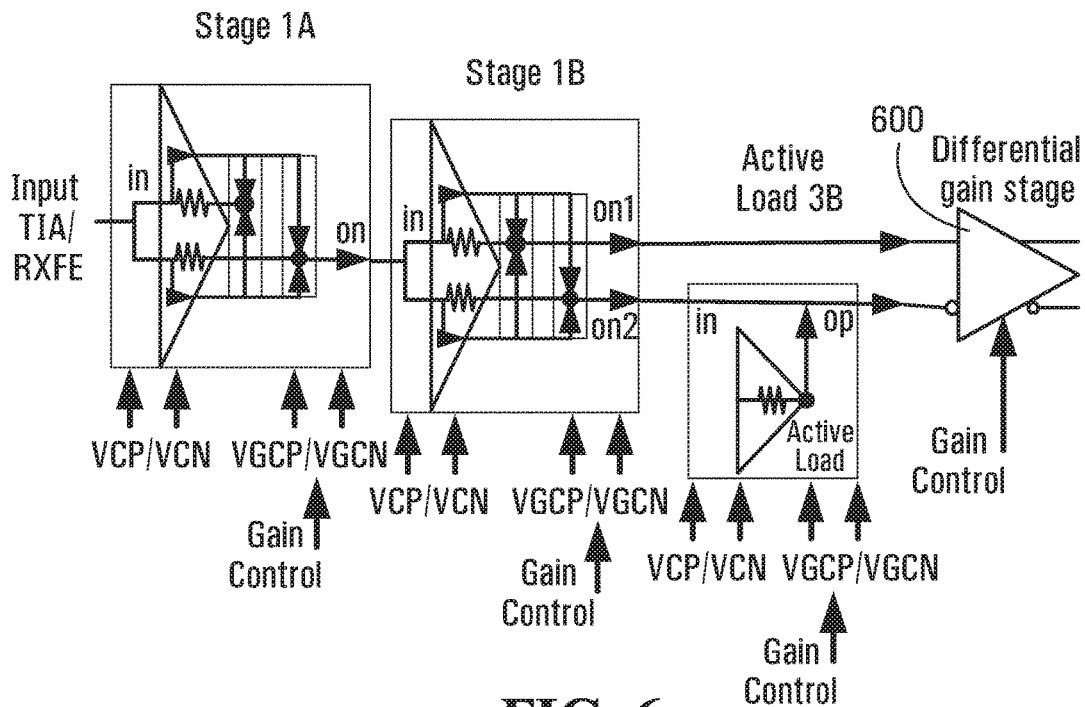
Figure 7:
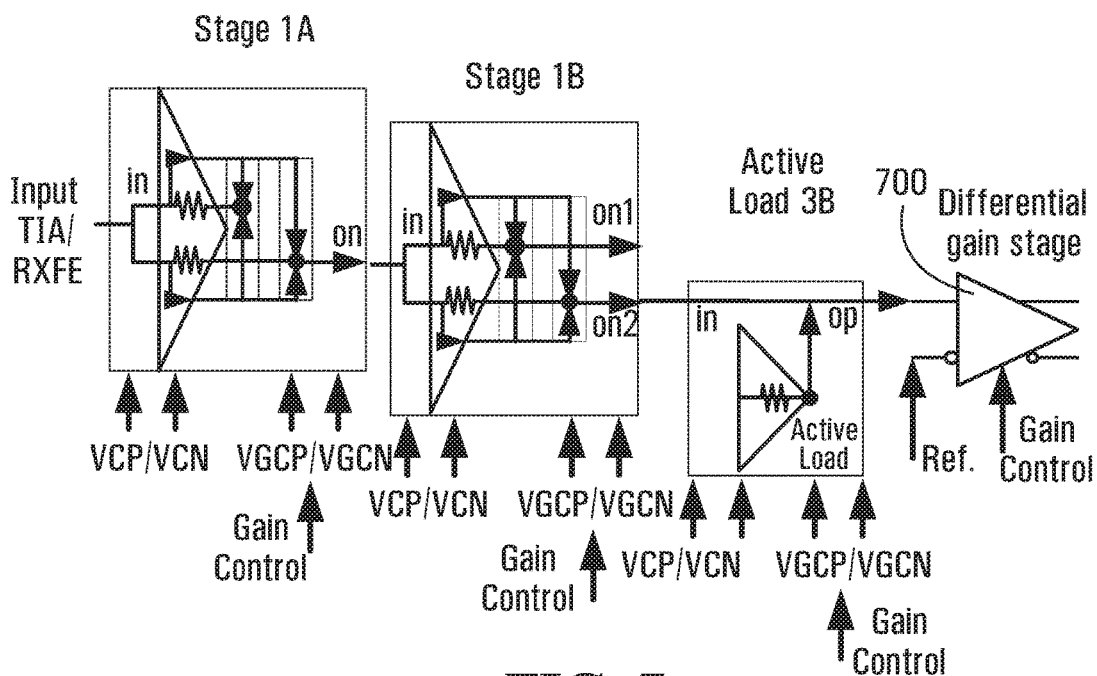
Figure 11:
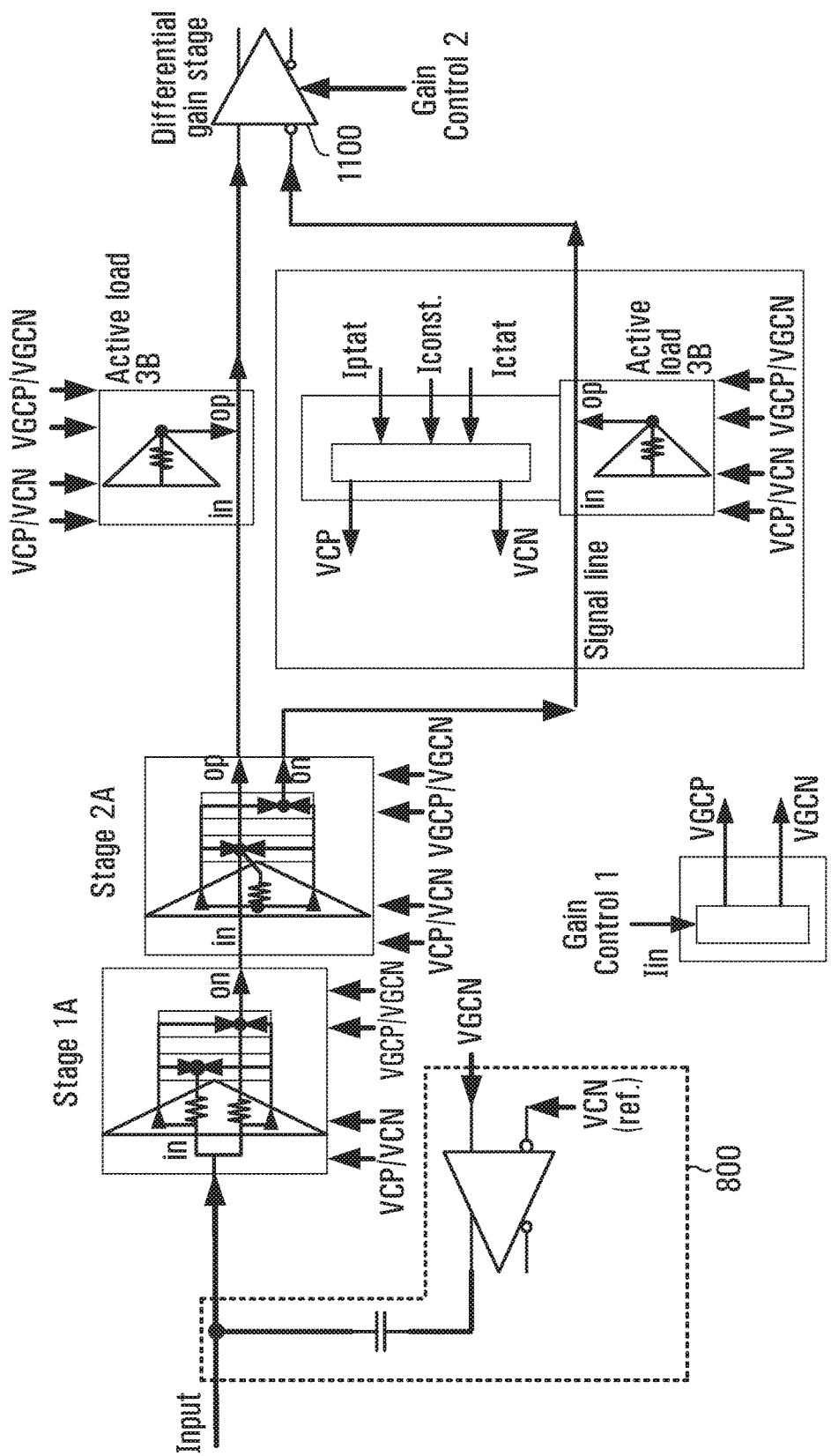
FIG. 11 is a block diagram illustrating another example architecture.

FIG. 11 is a block diagram illustrating another example architecture, which is based on the example architecture in FIG. 4, but with input bandwidth control by the input circuit 800 from FIG. 8, the gain controller GCblock from FIG. 9, and the temperature compensated Bias with Active Load circuit from FIG. 10. Similarly, these circuits could be used in other architectures, including those in FIGS. 5 to 7, with or without a differential gain stage 1100. FIG. 11 also includes another Active Load 3B circuit coupled to the op output of the Stage 2A circuit, which is optional but could be included in other architectures.

Figure 12A:
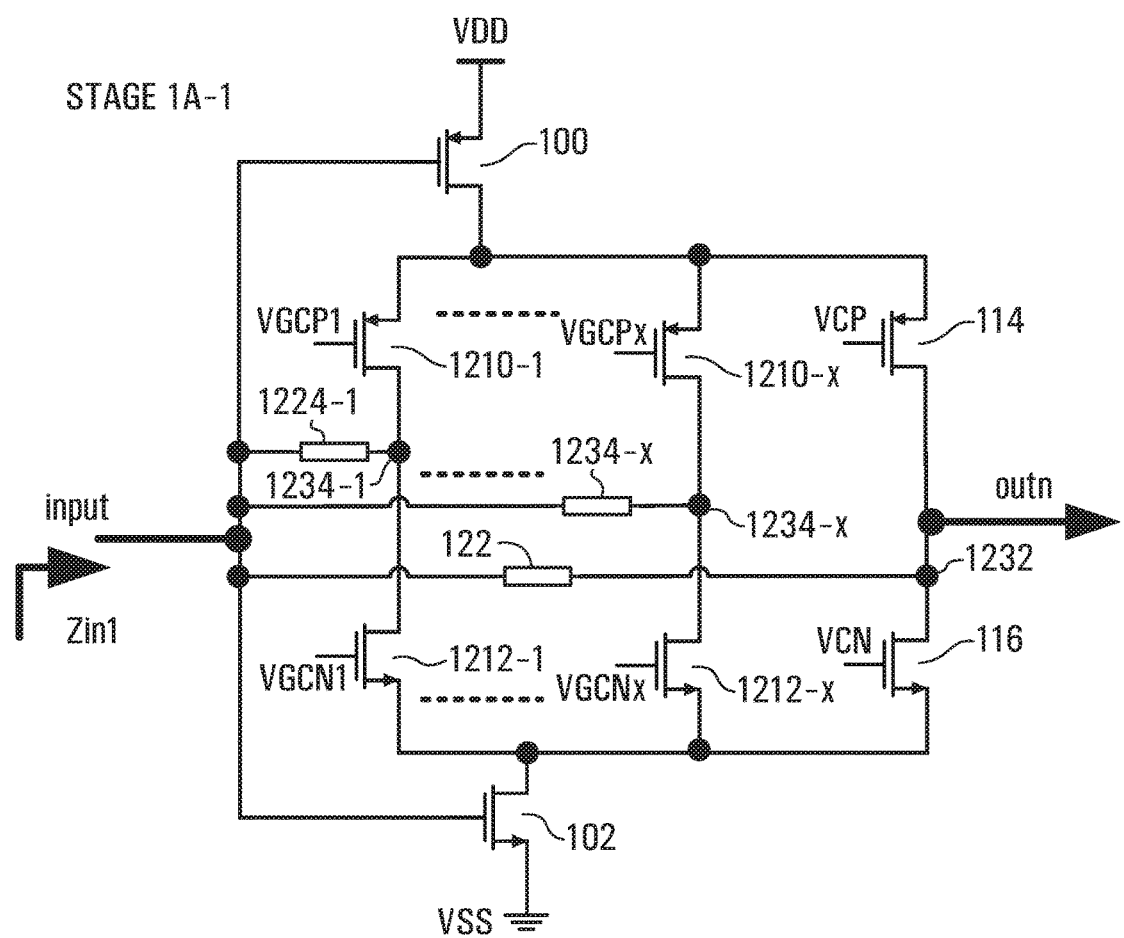
Figure 12B:
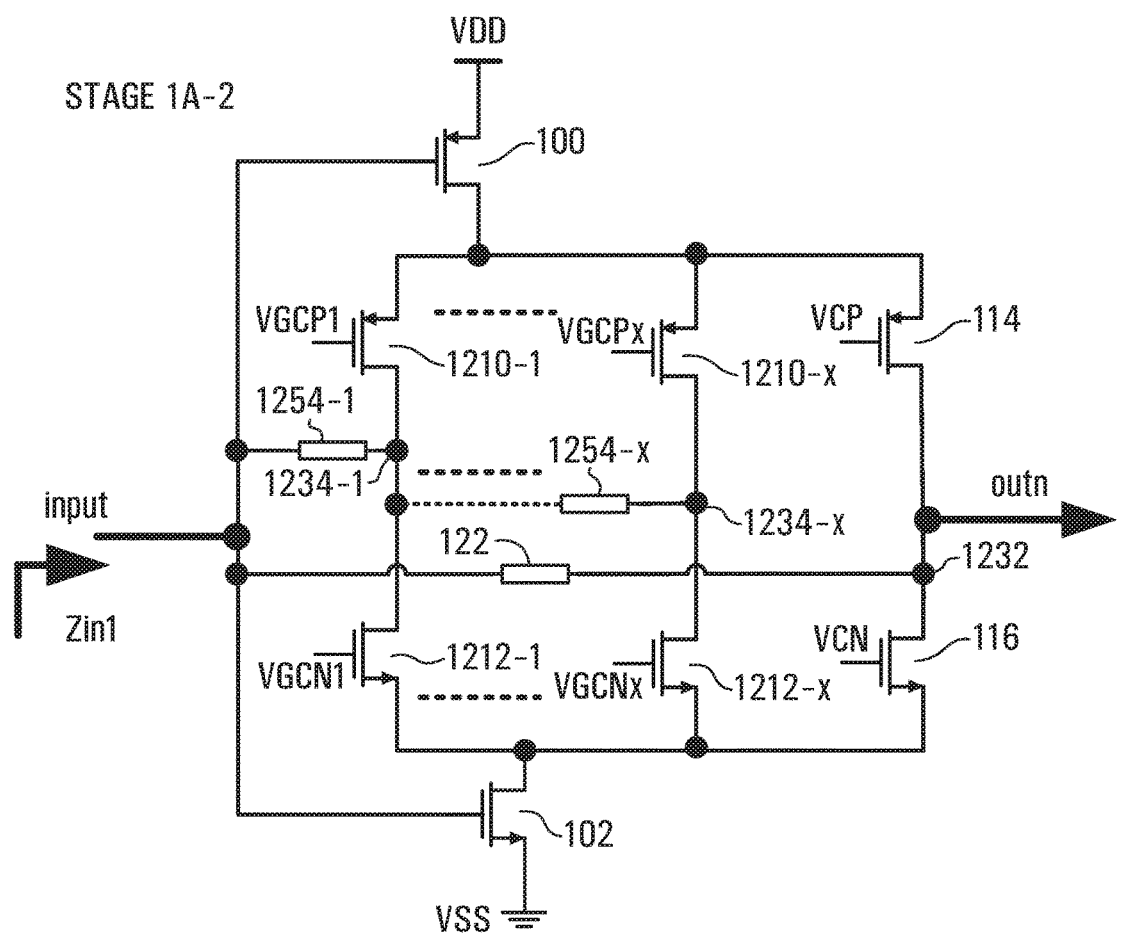
Figure 12C:
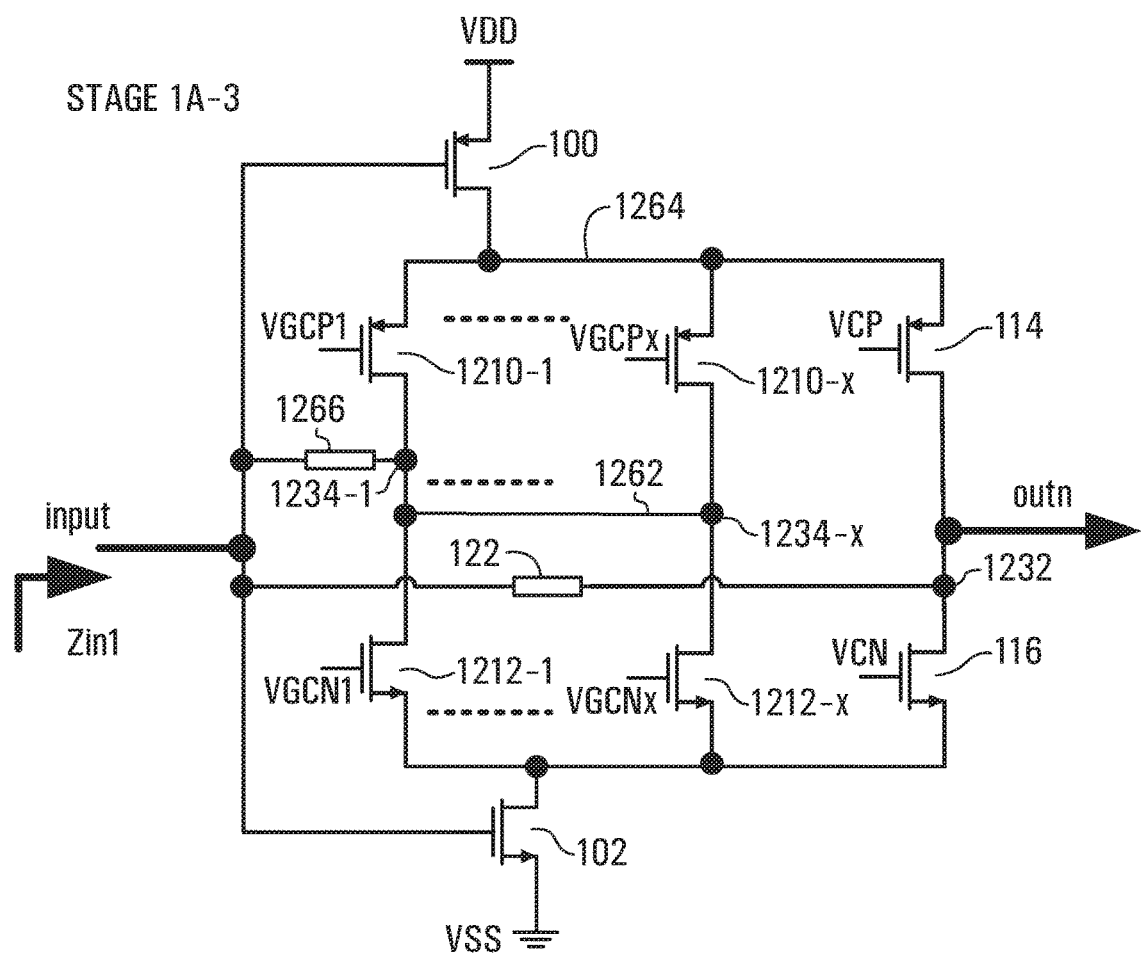

The Stage 1A, Stage 1B, Stage 2A, Stage 2B, and Stage 3B split cascade circuits are all dual split cascade circuits with main and secondary cascade paths or branches. "Higher order" split cascade circuits, including more than two cascade branches, are also possible. FIGS. 12A, 12B, and 12C are schematic diagrams of example multiple split cascade circuits based on the Stage 1A circuit. The Stage 1B, Stage 2A, Stage 2B, and Stage 3B circuits could also be extended in a similar manner, from dual cascade splits to multiple cascade splits. There are x secondary cascade branches in FIGS. 12A to 12C, and each has a pair of MOSFETs 1210-1/1212-1 to 1210-x/1212-x.

The secondary cascade branches can have parallel feedback paths and feedback circuits 1224-1 to 1224-x coupled to respective feedback points 1234-1 to 1234-x as shown in FIG. 12A. The feedback paths and networks could instead be cascaded, as in the Stage 1A-2 circuit in FIG. 12B. In a cascaded feedback path, there are feedback path segments between adjacent cascade branches. For example, the feedback path with the feedback circuit 1254-1 in FIG. 12B is coupled to the gate terminals of the MOSFETs 100, 102, and to the feedback point 1234-1 between the MOSFET pair 1210-1, 1212-1 of the first secondary cascade branch. A feedback path between the first feedback point 1234-1 and a feedback point in the next secondary cascade branch forms a second feedback path segment of a cascaded feedback path, and so on. In a parallel feedback path implementation such as the Stage 1A-1 circuit in FIG. 12A, each cascade branch from 1210-1/1212-1 to 1210-x/1212-x has its own respective feedback path and feedback circuit 1224-1 to 1224-x from a respective feedback point to the gate terminals of the MOSFETs 100, 102. In a cascaded feedback path implementation such as the Stage 1A-2 circuit in FIG. 12B, there is one "complete" feedback path from the $x^{th}$ cascode branch to the gate terminals of the MOSFETs 100, 102, and that feedback path includes multiple feedback path segments with respective feedback circuits 1254-1 to 1254-x.

FIG. 12C illustrates another embodiment. In the Stage 1A-3 circuit, the secondary cascade branches are built with parallel (common drain-source) pmos/nmos transistors and with separate gates controlled with analog or logic levels. The common drain-source connections are shown at 1262, 1264 in FIG. 12C, and there is a single secondary cascade branch feedback path with a feedback circuit 1266.

The examples in FIGS. 12A to 12O all relate to multiple secondary cascade circuit paths or branches. A primary cascade branch could also or instead be similarly constructed with multiple branches.

Figure 13:
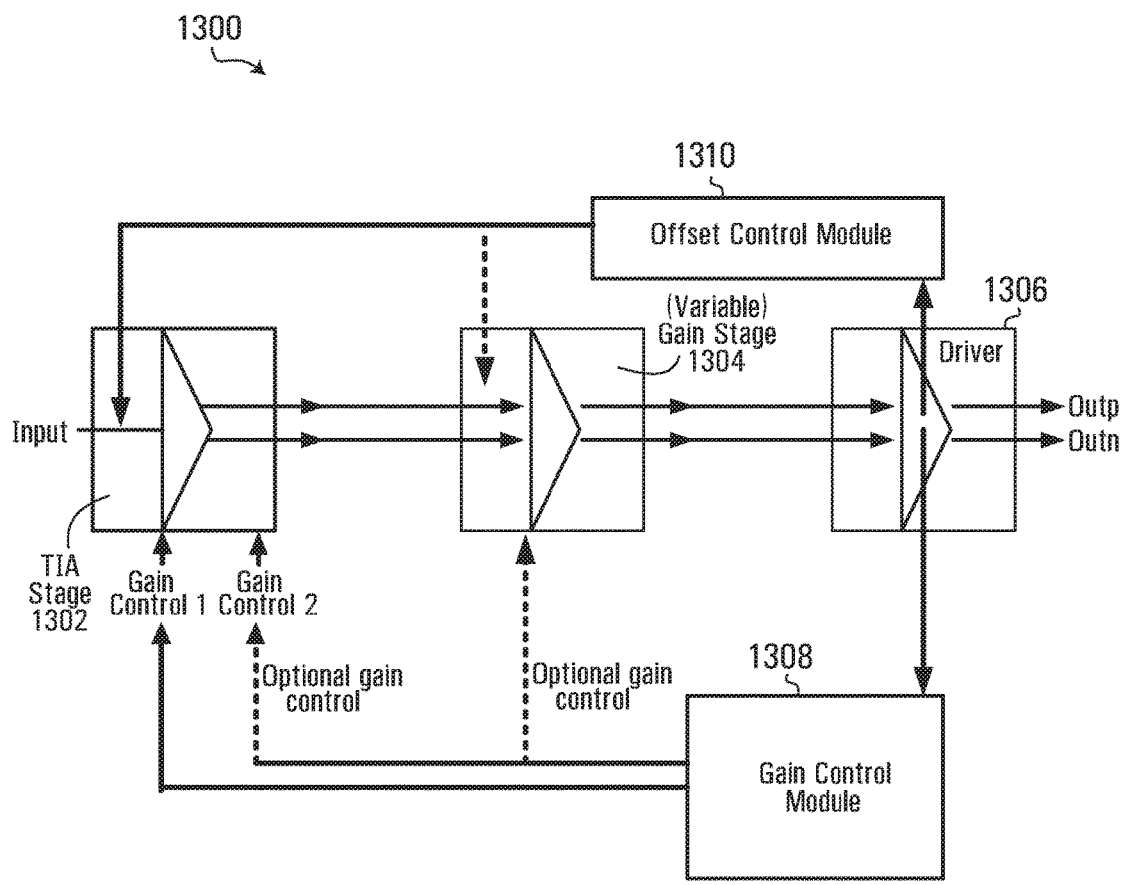
FIG. 13 is a block diagram illustrating an example TIA circuit.

FIG. 13 is a block diagram illustrating an example TIA circuit 1300, comprising a front-end module TIA stage 1302 as illustrated in FIG. 11, followed (optionally) by another gain stage 1304 with optional gain control (optionally a variable gain control stage), and an optional driver 1306. The main signal path in FIG. 13 includes the front-end TIA stage 1302, the optional gain stage 1304, and the optional driver 1306. In an embodiment, the driver 1306 is a circuit which allows the outputs to be sent out in a 50 ohm impedance environment, but this is just one example of a driver.

The example circuit includes also a gain control feedback module 1308 and an offset control module 1310. In an embodiment, the gain control feedback module 1308 and the offset control module 1310 are primarily analog type circuits, with an option to add a level of digital control.

The role of the gain control feedback module 1308 is to maintain the output signal amplitude at a defined level. Based on the sensed output signal level, it controls the gain of various blocks on the signal path. As noted above, the gain control feedback module 1308 could be primarily an analog design, with options to add a level of discrete (digital) gain control.

The offset control module 1310 is commonly used in differential gain stages, to balance the DC levels of the two outputs outp/outn. In addition, in the case of a TIA design as shown in FIG. 13, this block may also remove the DC component of the input signal (shown in FIG. 13 as a feedback to the "Input" node). The latter function is commonly used in TIA design.

Figure 14:
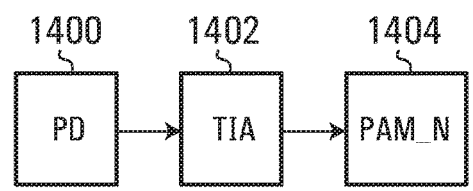
FIG. 14 is a block diagram illustrating an example implementation of circuits as disclosed herein.

FIG. 14 is a block diagram illustrating an example implementation of circuits as disclosed herein. The example shown in FIG. 14 is an optical module. The optical module includes at least a direct detection receiver such as a photodiode (PD) 1400 for performing direct detection on an incoming optical signal received at an optical Input/Output (10) to produce a direct detection output, and a TIA 1402 coupled to the PD 1400, which amplifies the direct detection output. In the example shown, the TIA 1402 is coupled to a PAM_N circuit 1404. The PAM_N circuit 1404 is intended to include any of various types of PAM circuits, with N ranging from 2 to 4 for PAM2 to PAM4, for example. There may be different and/or additional functionality in an optical module.

Split cascade circuits as disclosed herein, including multiple-stage circuits, could be implemented in a TIA 1402, in a PAM_N circuit 1404, and/or in the RXFE of a PAM_N circuit. These are example implementations, and others are possible.

Figure 15:
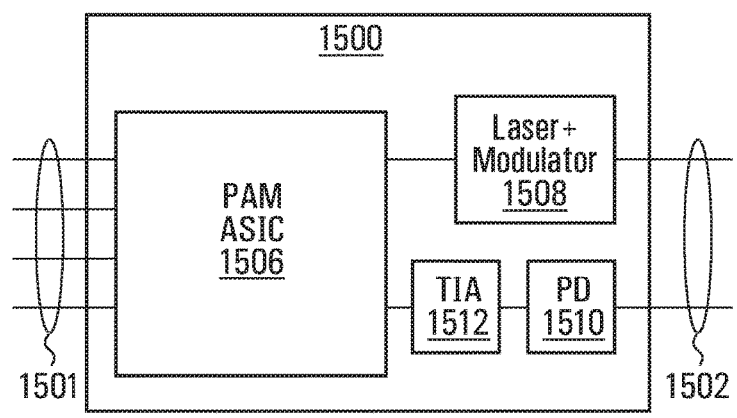
FIG. 15 is a block diagram of an example optical module with a TIA.

FIG. 15 is a block diagram of an example optical module with a TIA. The optical module has an optical IO 1502 and an electrical IO 1501. In respect of an optical signal received at the optical I/O 1502, there is a PD 1510 for performing direct detection to produce a direct detection output. The direct detection output is amplified in a TIA 1512. There is a PAM Application Specific Integrated Circuit (ASIC) 1506 configured to perform PAM demodulation on an output of the TIA 1512 to produce a signal at the electrical IO 1501. The TIA 1512, and/or an RXFE circuit in the PAM ASIC 1506, could include a split cascade circuit, including a multiple-stage circuit, as disclosed herein.

In respect of signals received at the electrical IO 1501, the PAM ASIC 1506 is further configured to perform PAM modulation based on an incoming electrical signal. The optical module also has a laser plus modulator 1508 that outputs an optical signal at the optical IO 1502 having a PAM modulated E-field based on the output of the PAM modulation.

Figure 16:
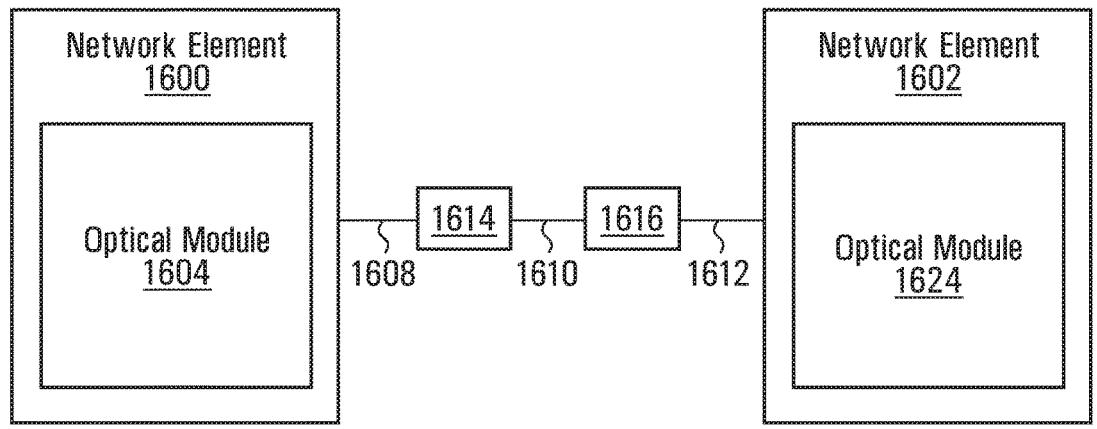
FIG. 16 is a block diagram of an example optical communications system.

FIG. 16 is a block diagram of an example optical communications system. The example system includes a number of network elements 1600, 1602 (only two shown, but there typically will be more). The network elements 1602, 1604 may be switches, routers, and/or servers for example. The network elements 1602, 1604 are interconnected by optical paths that include optical fiber and optical interfaces. In the specific example illustrated, network elements 1602, 1604 are interconnected by an optical path that includes optical fiber 1608, interface 1614, optical fiber 1610, interface 1616, and optical fiber 1612. The number of fibers and interfaces is implementation specific. In addition, at least one of the network elements includes an optical module 1604, 1624 having a split cascade circuit, possibly a multiple-stage circuit, as disclosed herein. In some embodiments, the optical modules 1604, 1624 are in accordance with the example of FIG. 15.

Figure 17:
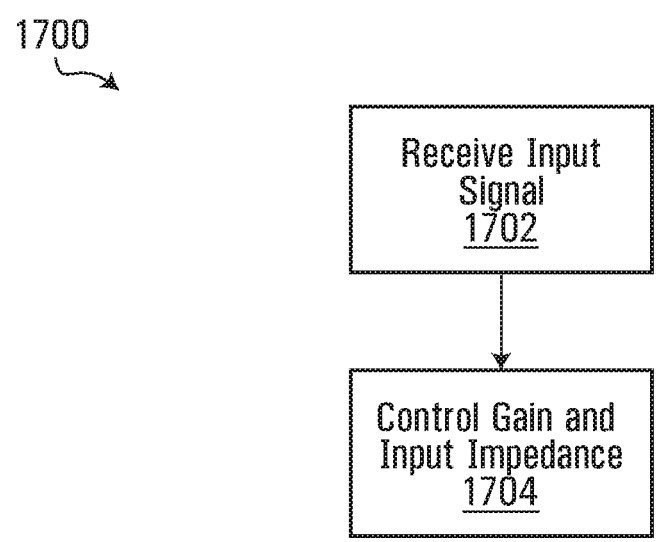
FIG. 17 is a flow diagram illustrating an example method.

FIG. 17 is a flow diagram illustrating an example method. The example method 1700 involves receiving an input signal at 1702. The input signal is received in a split cascade circuit that includes multiple cascade circuit paths between controllable switches that are coupled to respective voltage supply rails and a feedback path coupled between control terminals of the controllable switches and one of the cascade circuit paths. As shown at 1704, the method also involves controlling gain and input impedance of the split cascade circuit by controlling current flow through the multiple cascade circuit paths.

In an embodiment, the receiving at 1702 involves receiving the input signal at an input that is coupled to either the control terminals of the controllable switches or an input point between a pair of controllable switches of the cascade circuit path to which the feedback path is coupled.

The method could also involve additional operations. For example, in one embodiment controlling current flow involves controlling a pair of controllable switches in at least one of the cascade circuit paths based on a gain control signal. In this case, the method could also involve controlling, based on the gain control signal, an output impedance of an input circuit that is coupled to the input in a low pass configuration. A further embodiment involves generating the gain control signal by controlling current flow through multiple cascade current paths in a further split cascade circuit that is coupled to a current mirror and amplifier stage which includes a variable current source, a current mirror, and an amplifier.

An output impedance of a load circuit that is coupled to an output node of one of the cascode circuit paths of the split cascode circuit could also be controlled for one or more of: maintaining a target DC level of the output, controlling an impedance at the output node, and defining an overall AC transfer characteristic through the one of the cascade circuit paths that includes or is coupled to the output point.

In some embodiments, the method also involves generating temperature-compensate bias voltages to control a pair of controllable switches in at least one of the cascade circuit paths.

A method as shown in FIG. 17 could be used in conjunction with mare than one split cascade circuit. Current flow could be controlled in multiple split cascade stages that include respective split cascade circuits and are coupled together, with an output of one split cascade stage coupled to an input of another split cascade stage.

The example method 1700 is illustrative of one embodiment. Examples of additional operations that may be performed are described above, and others will be apparent from the description and drawings relating to apparatus and system implementations, for example. Further variations may be or become apparent.

What has been described is merely illustrative of the application of principles of embodiments of the present disclosure. Other arrangements and methods can be implemented by those skilled in the art.

For example, the contents of the drawings are intended solely for illustrative purposes, and the present invention is in no way limited to the particular example embodiments explicitly shown in the drawings and described herein.

We claim:

1. An apparatus comprising:
   an input to receive an input signal;
   a first controllable switch coupled to a first voltage supply rail and having a first control terminal;
   a second controllable switch coupled to a second voltage supply rail and having a second control terminal coupled to the first control terminal;
   a split cascode structure comprising multiple cascode circuit paths coupled between the first controllable switch and the second controllable switch, each of the multiple cascode circuit paths comprising a respective pair of controllable switches; and
   a feedback path coupled to the first and second control terminals and to a feedback point between the pair of controllable switches of one of the cascode circuit paths,
   wherein the apparatus further comprises:
   a third controllable switch coupled to the first voltage supply rail and having a control terminal coupled to a load;
   a fourth controllable switch coupled to the second voltage supply rail and having a control terminal coupled to the load;
   a cascode circuit path coupled between the third controllable switch and the fourth controllable switch, and comprising a pair of controllable switches; and
   a feedback path coupled to the load and to a feedback point between the pair of controllable switches of the cascode circuit path, and wherein a load point between the pair of controllable switches of the cascode circuit path is coupled to an output point in one of the multiple cascode circuit paths.

2. The apparatus of claim 1, further comprising:
a respective feedback path coupled to the first and second control terminals and to a feedback point between the pair of controllable switch elements of each of the cascode circuit paths other than the one of the cascode circuit paths.

3. The apparatus of claim 2, wherein the cascode circuit paths comprise more than two cascode circuit paths, and wherein the respective feedback paths comprise segments of a cascaded feedback path, the cascaded feedback path segments comprising a first feedback path segment coupled to the first and second control terminals and to a first feedback point between the pair of controllable switches of a first cascode circuit path of the multiple cascode circuit paths and one or more respective further feedback path segments between feedback points in adjacent cascode circuit paths of the multiple cascode circuit paths.

4. The apparatus of claim 1, further comprising:
an input, coupled to the first and second control terminals.

5. The apparatus of claim 1, further comprising:
a pair of outputs coupled to respective output points between the pairs of controllable switches of two of the cascode circuit paths;
an input, coupled to an input point between the pair of controllable switches of the one of the cascode circuit paths.

6. The apparatus of claim 1, further comprising:
a further cascode circuit path coupled between the third controllable switch and the fourth controllable switch, and comprising a pair of controllable switches; and
a further feedback path coupled to the load and to a further feedback point between the pair of controllable switches of the further cascode circuit path.

7. An apparatus comprising:
an input to receive an input signal;
a first controllable switch coupled to a first voltage supply rail and having a first control terminal;
a second controllable switch coupled to a second voltage supply rail and having a second control terminal coupled to the first control terminal;
a split cascode structure comprising multiple cascode circuit paths coupled between the first controllable switch and the second controllable switch, each of the cascode circuit paths comprising a respective pair of controllable switches; and
a feedback path coupled to the first and second control terminals and to a feedback point between the pair of controllable switches of one of the cascode circuit paths,
wherein the pair of controllable switches of the one of the cascode circuit paths comprises:
a first set of multiple controllable switches having respective first current carrying terminals coupled to the first controllable switch and respective second current carrying terminals coupled together; and
a second set of multiple controllable switches having respective first current carrying terminals coupled together and coupled to the second current carrying terminals of the controllable switches of the first set of multiple controllable switches, and respective second current carrying terminals coupled to the second controllable switch.

8. An apparatus comprising:
an input to receive an input signal;
a first controllable switch coupled to a first voltage supply rail and having a first control terminal;
a second controllable switch coupled to a second voltage supply rail and having a second control terminal coupled to the first control terminal;
a split cascode structure comprising multiple cascode circuit paths coupled between the first controllable switch and the second controllable switch, each of the cascode circuit paths comprising a respective pair of controllable switches; and
a feedback path coupled to the first and second control terminals and to a feedback point between the pair of controllable switches of one of the cascode circuit paths,
wherein the apparatus further comprises:
an amplifier coupled to receive a gain control signal based upon which the pair of controllable switches of the one of the cascode circuit paths are controlled, and a reference signal; and
a capacitor coupling an output of the amplifier to the input.

9. An apparatus comprising:
an input to receive an input signal;
a first controllable switch coupled to a first voltage supply rail and having a first control terminal;
a second controllable switch coupled to a second voltage supply rail and having a second control terminal coupled to the first control terminal;
a split cascode structure comprising multiple cascode circuit paths coupled between the first controllable switch and the second controllable switch, each of the cascode circuit paths comprising a respective pair of controllable switches; and
a feedback path coupled to the first and second control terminals and to a feedback point between the pair of controllable switches of one of the cascode circuit paths,
wherein the apparatus further comprises a gain controller, the gain controller comprising:
a split cascode stage comprising:
a third controllable switch coupled to the first voltage supply rail and having a control terminal;
a fourth controllable switch coupled to the second voltage supply rail and having a control terminal coupled to the control terminal of the third controllable switch;
multiple cascode circuit paths coupled between the third controllable switch and the fourth controllable switch, each of the multiple cascode circuit paths of the split cascode stage comprising a pair of controllable switches;
respective resistors coupling together the control terminals of the controllable switches of the cascode circuit paths in the split cascode stage that are coupled to the third controllable switch and coupling together the control terminals of the controllable switches of the cascode circuit paths in the split cascode stage that are coupled to the fourth controllable switch; and
feedback paths coupled to the control terminals of the third and fourth controllable switches and to respective feedback points between the pairs of controllable switches of the cascode circuit paths in the split cascode stage; and
a current mirror and amplifier stage comprising:
a variable current source;
a current mirror coupled to the variable current source and to a control terminal of a controllable switch, of the pair of controllable switches of one of the cascode circuit paths in the split cascode stage, which is coupled to the fourth controllable switch; and an amplifier coupled to the current mirror, the amplifier having an output coupled to a control terminal of a controllable switch, of the pair of controllable switches of the one of the cascode circuit paths in the split cascode stage, which is coupled to the third controllable switch, the amplifier further having inputs coupled across one of the feedback paths that is coupled to the control terminals of the third and fourth controllable switches and to one of the respective feedback points between the pairs of controllable switches of the cascode circuit paths in the split cascode stage, wherein gain control signals to control the pair of controllable switches of the one of the cascode circuit paths in the split cascode stage are generated at the control terminals of the pair of controllable switches of the one of the cascode circuit paths in the split cascode stage.

10. An apparatus, comprising:
an input to receive an input signal;
a first controllable switch coupled to a first voltage supply rail and having a first control terminal;
a second controllable switch coupled to a second voltage supply rail and having a second control terminal coupled to the first control terminal;
a split cascode structure comprising multiple cascode circuit paths coupled between the first controllable switch and the second controllable switch, each of the multiple cascode circuit paths comprising a respective pair of controllable switches;
a feedback path coupled to the first and second control terminals and to a feedback point between the pair of controllable switches of one of the cascode circuit paths;
a third controllable switch coupled to the first voltage supply rail and having a control terminal coupled to a variable load;
a fourth controllable switch coupled to the second voltage supply rail and having a control terminal coupled to the variable load;
multiple further cascode circuit paths coupled between the third controllable switch and the fourth controllable switch, each of the further cascode circuit paths comprising a pair of controllable switches;
feedback paths coupled to the variable load and to respective feedback points between the pairs of controllable switches of the further cascode circuit paths; and
a bias circuit coupled to control terminals of the pair of controllable switches of one of the cascode circuit paths and to the variable load, to generate control signals to control the pair of controllable switches and the variable load,
wherein a load point between the pair of controllable switches of the one of the cascode circuit paths is coupled to an output point between the pair of controllable switches of one of the cascode circuit paths of the apparatus.

11. A device having an architecture comprising multiple stages of an apparatus, the apparatus comprising:
an input to receive an input signal;
a first controllable switch coupled to a first voltage supply rail and having a first control terminal;
a second controllable switch coupled to a second voltage supply rail and having a second control terminal coupled to the first control terminal;
a split cascode structure comprising multiple cascode circuit paths coupled between the first controllable switch and the second controllable switch, each of the cascode circuit paths comprising a respective pair of controllable switches; and
a feedback path coupled to the first and second control terminals and to a feedback point between the pair of controllable switches of one of the cascode circuit paths, and
the multiple stages comprising:
a first stage having an output coupled to an output point between the pair of controllable switches of one of the cascode circuit paths of the first stage; and
a second stage having an input coupled to the output of the first stage and a pair of outputs coupled to respective output points between the pairs of controllable switches of two of the cascode circuit paths of the second stage.

12. The device of claim 11, further comprising:
an active load stage, the active load stage comprising:
a first controllable switch coupled to the first voltage supply rail and having a control terminal coupled to a load;
a second controllable switch coupled to the second voltage supply rail and having a control terminal coupled to the load;
a cascode circuit path coupled between the first and second controllable switches of the active load stage, and comprising a pair of controllable switches;
a further cascode circuit path coupled between the first and second controllable switches of the active load stage, and comprising a pair of controllable switches;
a feedback path coupled to the load and to a feedback point between the pair of controllable switches of the cascode circuit path of the active load stage;
a further feedback path coupled to the load and to a further feedback point between the pair of controllable switches of the further cascode circuit path,
wherein a load point between the pair of controllable switches of the cascode circuit path of the active load stage is coupled to an output of one of the multiple stages.

13. The device of claim 11, further comprising:
a differential gain stage coupled to the pair of outputs of the second stage.

14. The device of claim 11, further comprising:
an amplifier coupled to receive a gain control signal based upon which the pair of controllable switches of the one of the cascode circuit paths in the first stage are controlled, and a reference signal; and
a capacitor coupling an output of the amplifier to the input of the first stage.

15. The device of claim 11, further comprising a gain controller, the gain controller comprising:
a split cascode stage comprising:
a first controllable switch coupled to the first voltage supply rail and having a control terminal;
a second controllable switch coupled to the second voltage supply rail and having a control terminal coupled to the control terminal of the first controllable switch of the split cascode stage;
multiple cascode circuit paths coupled between the first and second controllable switches of the split cascode stage, each of the multiple cascode circuit paths of the split cascode stage comprising a pair of controllable switches;
respective resistors coupling together the control terminals of the controllable switches of the cascode circuit paths that are coupled to the first controllable switch of the split cascode stage and coupling together the control terminals of the controllable switches of the cascode circuit paths stage that are coupled to the second controllable switch of the split cascode stage; and feedback paths coupled to the control terminals of the first and second controllable switches of the split cascode stage and to respective feedback points between the pairs of controllable switches of the cascode circuit paths in the split cascode stage; and a current mirror and amplifier stage comprising:

a variable current source;

a current mirror coupled to the variable current source and to a control terminal of a controllable switch, of the pair of controllable switches of one of the cascode circuit paths in the split cascode stage, which is coupled to the second controllable switch of the split cascode stage; and an amplifier coupled to the current mirror, the amplifier having an output coupled to a control terminal of a controllable switch, of the pair of controllable switches of the one of the cascode circuit paths in the split cascode stage, which is coupled to the first controllable switch of the split cascode stage, the amplifier further having inputs coupled across one of the feedback paths that is coupled to the control terminals of the first and second controllable switches of the split cascode stage and to one of the respective feedback points between the pairs of controllable switches of the cascode circuit paths in the split cascode stage, wherein gain control signals to control the pair of controllable switches of the one of the cascode circuit paths in the split cascode stage are generated at the control terminals of the pair of controllable switches of the one of the cascode circuit paths in the split cascode stage.

16. The device of claim 11, further comprising:

temperature and gain control compensator comprising:

a first controllable switch coupled to the first voltage supply rail and having a control terminal coupled to a variable load;

a second controllable switch coupled to the second voltage supply rail and having a control terminal coupled to the variable load;

multiple cascode circuit paths coupled between the first and second controllable switches of the temperature and gain control compensator, each of the cascode circuit paths of the temperature and gain control compensator comprising a pair of controllable switches;

feedback paths coupled to the variable load and to respective feedback points between the pairs of controllable switches of the cascode circuit paths of the temperature and gain control compensator; and a bias circuit coupled to control terminals of the pair of controllable switches of one of the cascode circuit paths of the temperature and gain control compensator and to the variable load, to generate control signals to control the pair of controllable switches of the temperature and gain control compensator and the variable load, wherein a load point between the pair of controllable switches of the one of the cascode circuit paths of the temperature and gain control compensator is coupled to an output of one of the multiple stages.

17. A trans-impedance amplifier comprising:

the device of claim 11;

a gain stage coupled to an output of the device;

a driver coupled to an output of the gain stage;

a gain control module coupled to the driver and to the device, to generate a gain control signal for at least the device;

an offset control module coupled to the driver and to the device.

18. An optical module comprising:

an optical IO (input/output) and an electrical IO;

a photo-diode for performing direct detection on an incoming optical signal received at the optical IO to produce a direct detection output;

a trans-impedance amplifier (TIA) that amplifies the direct detection output;

a PAM ASIC configured to perform PAM demodulation an output of the TIA to produce a signal at the electrical IO and to perform PAM modulation based on an incoming electrical signal at the electrical IO;

a laser that outputs an optical signal at the optical IO having a PAM modulated E-field based on the output of the PAM modulation, wherein at least one of the TIA and the PAM ASIC comprises the device of claim 11.

19. An optical communications system comprising:

a plurality of network elements interconnected by optical paths, at least one of the network elements having an optical module comprising the device of claim 11.

20. A method comprising:

receiving an input signal in a split cascode circuit that includes multiple cascode circuit paths between controllable switches that are coupled to respective voltage supply rails and a feedback path coupled between control terminals of the controllable switches and one of the cascode circuit paths;

controlling gain and input impedance of the split cascode circuit by controlling current flow through the multiple cascode circuit paths, wherein the method further comprises:

controlling an output impedance of a load circuit that is coupled to an output node of one of the cascode circuit paths of the split cascode circuit for one or more of: maintaining a target Direct Current (DC) level of an output, controlling an impedance at the output node, and defining an overall Alternating Current (AC) transfer characteristic through the one of the cascode circuit paths that includes or is coupled to an output point.

21. The method of claim 20, wherein the receiving comprises receiving the input signal at an input which is coupled to either the control terminals of the controllable switches or an input point between a pair of controllable switches of the one of the cascode circuit paths.

22. The method of claim 21, wherein controlling the current flow comprises controlling a pair of controllable switches in at least one of the cascode circuit paths based on a gain control signal, the method further comprising controlling, based on the gain control signal, an output impedance of an input circuit that is coupled to the input in a low pass configuration.

23. The method of claim 21, wherein controlling the current flow comprises controlling a pair of controllable switches in at least one of the cascode circuit paths based on a gain control signal, the method further comprising generating the gain control signal by controlling current flow through multiple cascode current paths in a further split cascode circuit that is coupled to a current mirror and amplifier stage comprising a variable current source, a current mirror, and an amplifier.

24. A method comprising:
receiving an input signal in a split cascode circuit that includes multiple cascode circuit paths between controllable switches that are coupled to respective voltage supply rails and a feedback path coupled between control terminals of the controllable switches and one of the cascode circuit paths;
controlling gain and input impedance of the split cascode circuit by controlling current flow through the multiple cascode circuit paths,
wherein controlling the current flow comprises controlling a pair of controllable switches in at least one of the cascode circuit paths using respective bias voltages,
the method further comprising generating the bias voltages as temperature-compensated bias voltages.

25. The method of claim 21, wherein controlling the current flow comprises controlling current flow in multiple split cascode stages that include respective split cascode circuits and are coupled together with an output of one split cascode stage coupled to an input of another split cascode stage.

26. An active load circuit comprising:
a first controllable switch coupled to a first voltage supply rail and having a control terminal coupled to a load;
a second controllable switch coupled to a second voltage supply rail and having a control terminal coupled to the load, the second voltage supply rail being different from the first voltage supply rail;
a cascode circuit path coupled between the first and second controllable switches, and comprising a pair of controllable switches serially coupled with the first and second controllable switches;
a further cascode circuit path coupled between the first and second controllable switches, and comprising a pair of controllable switches serially coupled with the first and second controllable switches;
a feedback path coupled to the load and to a feedback point between the pair of controllable switches of the cascode circuit path;
a further feedback path coupled to the load and to a further feedback point between the pair of controllable switches of the further cascode circuit path; and
an input between the pair of controllable switches of the cascode circuit path.

* * * * *